(12) United States Patent
Lee et al.

(10) Patent No.: US 11,948,873 B2
(45) Date of Patent: Apr. 2, 2024

(54) SEMICONDUCTOR PACKAGE INCLUDING A SUPPORT SOLDER BALL

(71) Applicant: SAMSUNG ELECTRONICS CO., LTD., Suwon-si (KR)

(72) Inventors: Jeonghyun Lee, Seoul (KR); Dongwook Kim, Asan-si (KR); Hwan Pil Park, Hwaseong-si (KR); Jongbo Shim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 17/555,583

(22) Filed: Dec. 20, 2021

(65) Prior Publication Data

US 2022/0352058 A1    Nov. 3, 2022

(30) Foreign Application Priority Data

May 3, 2021    (KR) .......................... 10-2021-0057298

(51) Int. Cl.
*H01L 23/498*    (2006.01)
*H01L 23/00*    (2006.01)
(Continued)

(52) U.S. Cl.
CPC ........ *H01L 23/49816* (2013.01); *H01L 23/16* (2013.01); *H01L 23/31* (2013.01); *H01L 24/14* (2013.01); *H01L 24/16* (2013.01); *H01L 24/17* (2013.01); *H01L 2224/13001* (2013.01); *H01L 2224/13005* (2013.01); *H01L 2224/13006* (2013.01); *H01L 2224/1301* (2013.01);
(Continued)

(58) Field of Classification Search
CPC . H01L 2224/13001; H01L 2224/13005; H01L 2224/13006; H01L 2224/1301; H01L 2224/13016; H01L 2224/13017; H01L 2224/1302; H01L 2224/13561; H01L 2224/13562; H01L 2224/13563; H01L 25/0657; H01L 23/562
See application file for complete search history.

(56) References Cited

U.S. PATENT DOCUMENTS 7,855,443 B2    12/2010    Tsai et al.
9,859,200 B2    1/2018    Park et al.
(Continued)

*Primary Examiner* — Bradley Smith
*Assistant Examiner* — William Henry Anderson
(74) *Attorney, Agent, or Firm* — F. Chau & Associates, LLC

(57) ABSTRACT

A semiconductor package including: a first substrate; a first semiconductor device on the first substrate; a first mold layer covering the first semiconductor device; a second substrate on the first mold layer; a support solder ball interposed between the first substrate and the second substrate, and electrically disconnected from the first substrate or the second substrate, wherein the support solder ball includes a core and is disposed near a first sidewall of the first semiconductor device; and a substrate connection solder ball disposed between the first sidewall of the first semiconductor device and the support solder ball to electrically connect the first substrate to the second substrate, wherein a top surface of the first semiconductor device has a first height from a top surface of the first substrate, and the core has a second height which is equal to or greater than the first height.

20 Claims, 28 Drawing Sheets

(51) Int. Cl.
*H01L 23/16* (2006.01)
*H01L 23/31* (2006.01)

(52) U.S. Cl.
CPC ............... *H01L 2224/13016* (2013.01); *H01L 2224/1302* (2013.01); *H01L 2224/13561* (2013.01); *H01L 2224/13562* (2013.01); *H01L 2224/13563* (2013.01); *H01L 2225/1058* (2013.01)

(56) References Cited

U.S. PATENT DOCUMENTS

| | | |
|---|---|---|
| 9,908,203 B2 | 3/2018 | Cheng et al. |
| 9,913,385 B2 | 3/2018 | Lin et al. |
| 10,679,930 B2 | 6/2020 | Lee et al. |
| 10,867,976 B2 | 12/2020 | Chen et al. |
| 10,879,203 B2 | 12/2020 | Chen et al. |
| 2012/0299197 A1* | 11/2012 | Kwon ................. H01L 23/3157 257/777 |
| 2015/0325507 A1* | 11/2015 | Uzoh ................. B23K 35/0266 257/737 |
| 2016/0020195 A1* | 1/2016 | Chiang ................. H01L 25/50 438/109 |
| 2019/0123027 A1* | 4/2019 | Yu ........................... H01L 24/81 |
| 2020/0043854 A1* | 2/2020 | Oh ........................... H01L 24/16 |
| 2020/0411444 A1 | 12/2020 | Tsai et al. |

\* cited by examiner

SEMICONDUCTOR PACKAGE INCLUDING A SUPPORT SOLDER BALL

CROSS-REFERENCE TO RELATED APPLICATION

This U.S. non-provisional patent application claims priority under 35 U.S.C. § 119 to Korean Patent Application No. 10-2021-0057298, filed on May 3, 2021, in the Korean Intellectual Property Office, the disclosure of which is incorporated by reference herein in its entirety.

TECHNICAL FIELD

The present disclosure relates to a semiconductor package, and in particular, to a semiconductor package including a support solder ball.

DISCUSSION OF RELATED ART

A semiconductor package is a metal, plastic, glass or ceramic casing containing one or more semiconductor devices or integrated circuits. Conventionally, the semiconductor package includes a printed circuit board (PCB) and a semiconductor chip die, which is mounted on the PCB and is electrically connected to the PCB using bonding wires or bumps. Many studies are being conducted to increase the reliability and durability of the semiconductor package.

SUMMARY

An embodiment of the inventive concept provides a semiconductor package with increased reliability.

According to an embodiment of the inventive concept, a semiconductor package may include: a first substrate; a first semiconductor device on the first substrate; a first mold layer covering the first semiconductor device; a second substrate on the first mold layer, a support solder ball interposed between the first substrate and the second substrate, and electrically disconnected from the first substrate or the second substrate, wherein the support solder ball includes a core and is disposed near a first sidewall of the first semiconductor device; and a substrate connection solder ball disposed between the first sidewall of the first semiconductor device and the support solder ball to electrically connect the first substrate to the second substrate, wherein a top surface of the first semiconductor device has a first height from a top surface of the first substrate, and the core has a second height which is equal to or greater than the first height.

According to an embodiment of the inventive concept, a semiconductor package may include: a first substrate; a first semiconductor device, which is disposed on the first substrate and has a first sidewall and a second sidewall, which are orthogonal to each other when viewed in a plan view, wherein the first sidewall and the second sidewall are parallel to a first direction and a second direction, respectively; a second substrate on the first semiconductor device; and inner solder balls disposed between the first substrate and the second substrate to enclose the first semiconductor device, wherein the inner solder balls include: first inner solder balls, which are arranged near the first sidewall of the first semiconductor device to form m rows parallel to the first direction; and second inner solder balls, which are arranged near the second sidewall of the first semiconductor device to form n columns parallel to the second direction, n is greater than m, and at least one of the first inner solder balls, which is farthest from the first sidewall, comprises a core provided therein.

According to an embodiment of the inventive concept, a semiconductor package may include: a first substrate; a first semiconductor device on the first substrate; an under-fill layer between the first semiconductor device and the first substrate; a mold layer covering the first semiconductor device; a second substrate on the mold layer; a support solder ball interposed between the first substrate and the second substrate, and electrically disconnected from the first substrate or the second substrate, wherein the support solder ball includes a core and is disposed near a first sidewall of the first semiconductor device; and a substrate connection solder ball disposed between the first sidewall of the first semiconductor device and the support solder ball to electrically connect the first substrate to the second substrate, wherein the support solder ball is in contact with a top surface of the first substrate or a bottom surface of the second substrate, a top surface of the first semiconductor device has a first height from the top surface of the first substrate, the core has a second height greater than the first height, and a difference between the second height and the first height is 10 μm to 50 μm.

DETAILED DESCRIPTION OF THE EMBODIMENTS

Example embodiments of the inventive concept will now be described more fully with reference to the accompanying drawings. It will be understood that, although the terms "first", "second", etc. may be used herein to describe various elements, components, regions, layers and/or sections, these elements, components, regions, layers and/or sections should not be limited by these terms. These terms are simply used to distinguish one element, component, region, layer or section from another element, component, region, layer or section.

Figure 1:
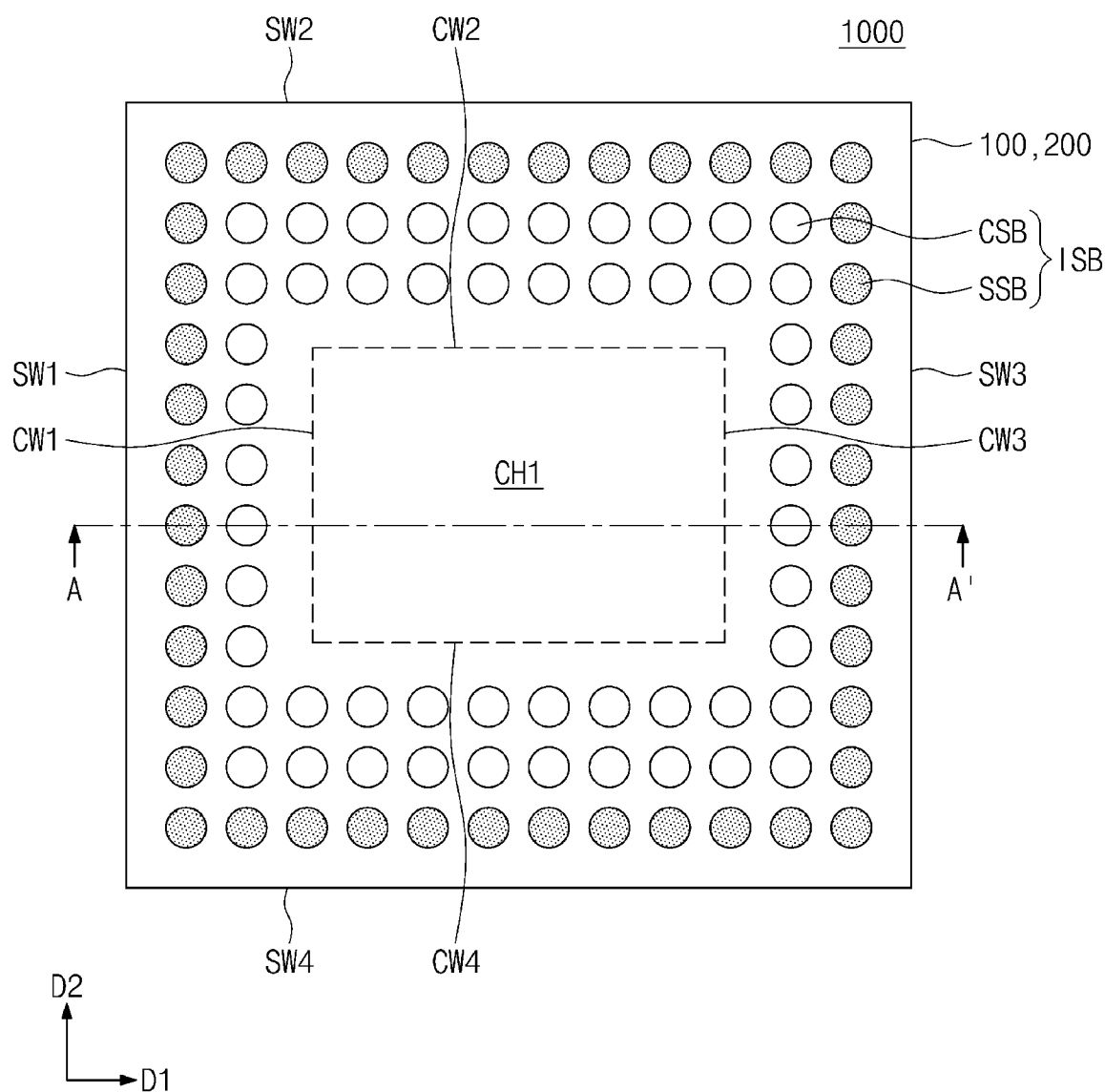
FIG. 1 is a plan view illustrating a semiconductor package according to an embodiment of the inventive concept.
Figure 2:
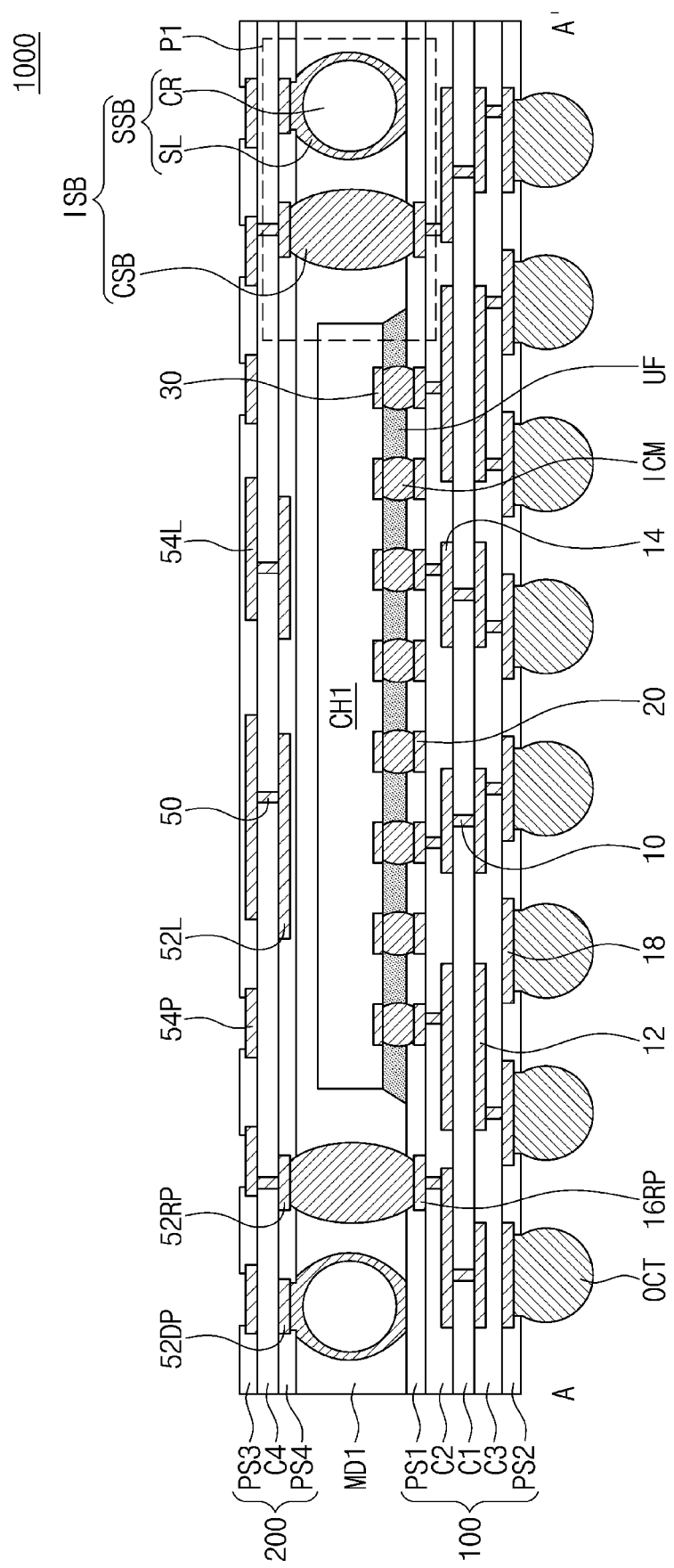
FIG. 2 is a sectional view taken along a line A-A' of FIG. 1.

FIG. 1 is a plan view illustrating a semiconductor package according to an embodiment of the inventive concept. FIG. 2 is a sectional view taken along a line A-A' of FIG. 1. FIGS. 3A to 3E are enlarged sectional views, each of which illustrates a portion 'P1' of FIG. 2.

Referring to FIGS. 1 to 3E, a semiconductor package 1000 according to the present embodiment may include a first substrate 100, a first semiconductor device CH1, a first mold layer MD1, and a second substrate 200. The first substrate 100 may be, for example, a double-sided or multi-layered printed circuit board. The substrate 100 may include a first body layer C1, a second body layer C2, and a third body layer C3. Each of the first body layer C1, the second body layer C2, and the third body layer C3 may be formed of or include an insulating material. For example, each of the first body layer C1, the second body layer C2, and the third body layer C3 may be formed of or include at least one of thermosetting resins (e.g., epoxy resin), thermoplastic resins (e.g., polyimide), composite materials (e.g., prepreg or fire resist-4 (FR4)), in which a reinforcement element (e.g., glass fiber and/or inorganic filler) is pre-impregnated with a thermoplastic or thermosetting resin matrix, or photo-curable resins, but the inventive concept is not limited thereto.

The second body layer C2 may be placed on the first body layer C1, and the third body layer C3 may be placed below the first body layer C1. First inner wires 14 and second inner wires 12 may be disposed on top and bottom surfaces, respectively, of the first body layer C1. First upper conductive pads 20 and 16RP may be disposed on the second body layer C2. The first upper conductive pads 20 and 16RP may include a chip connection pad 20 and a first substrate connection pad 16RP. First lower conductive pads 18 may be disposed on a bottom surface of the third body layer C3. A first upper protection layer PS1 may be disposed on the second body layer C2 to expose the first upper conductive pads 20 and 16RP. For example, the first upper protection layer PS1 may include openings to expose the first upper conductive pads 20 and 16RP. A first lower protection layer PS2 may be disposed below the third body layer C3 to expose the first lower conductive pads 18. For example, the first lower protection layer PS2 may include openings to expose the first lower conductive pads 18.

First vias 10 may be disposed in the first to third body layers C1, C2, and C3 to electrically connect the first and second inner wires 14, 12, the first upper conductive pads 20 and 16RP, and the first lower conductive pads 18 to each other. The first protection layers PS1 and PS2 may be photosensitive solder resist (PSR) layers. Outer connection terminals OCT may be bonded to the first lower conductive pads 18. The outer connection terminals OCT may include at least one of solder balls, conductive bumps, or conductive pillars. The solder ball may be formed of or include at least one of tin, lead, silver, aluminum, gold, or nickel. The conductive bump or the conductive pillar may be formed of or include copper.

The first semiconductor device CH1 may be a single semiconductor die, a single semiconductor chip, or a semiconductor package including a plurality of semiconductor dies of the same type or different types. The first semiconductor device CH1 may be one of image sensor chips (e.g., a complementary metal-oxide-semiconductor (CMOS) imaging sensor (CIS)), memory device chips (e.g., FLASH memory chips, dynamic random access memory (DRAM) chips, static random access memory (SRAM) chips, electrically erasable programmable read only memory (EEPROM) chips, phase-change random access memory (PRAM) chips, magnetic random access memory (MRAM) chips, resistive random access memory (ReRAM) chips, high bandwidth memory (HBM) chips, hybrid memory cubic (HMC) chips), microelectromechanical system (MEMS) chips, or application-specific integrated circuit (ASIC) semiconductor chips.

The first semiconductor device CH1 may include chip pads 30, which are disposed on a bottom surface thereof. The chip pads 30 of the first semiconductor device CH1 may be connected to the chip connection pad 20 in a flip-chip bonding manner by first inner connection members ICM. The first inner connection members ICM may include at least one of solder balls, conductive bumps, or conductive pillars.

An under-fill layer UF may be interposed between the first semiconductor device CH1 and the first substrate 100. The under-fill layer UF may include at least one of thermosetting resins or photo-curable resins. In addition, the under-fill layer UF may include an organic filler or an inorganic filler.

The first mold layer MD1 may cover a sidewall of the first semiconductor device CH1 and a top surface of the first substrate 100. The first mold layer MD1 may be formed of or include an insulating resin (e.g., epoxy molding compound (EMC)). The first mold layer MD1 may further include fillers, which are dispersed in the insulating resin.

The second substrate 200 may be, for example, a double-sided printed circuit board. For example, the second substrate 200 may include a fourth body layer C4, second upper conductive pads 54p and an upper conductive line 54L, which are disposed on a top surface of the fourth body layer C4, and second lower conductive pads 52RP and 52DP and a lower conductive line 52L, which are disposed on a bottom surface of the fourth body layer C4. The second substrate 200 may include second vias 50, which penetrate the fourth body layer C4 and connect the second upper conductive pads 54p and the upper conductive line 54L to the second lower conductive pads 52RP and 52DP and the lower conductive line 52L. The second lower conductive pads 52RP and 52DP may include second substrate connection pads 52RP and a dummy conductive pad 52DP.

A second upper protection layer PS3 may be disposed on the fourth body layer C4, and a second lower protection layer PS4 may be disposed on a bottom surface of the fourth body layer C4. The second upper protection layer PS3 may expose the second upper conductive pads 54p. For example, the second upper protection layer PS3 may includes openings to expose the second upper conductive pads 54p. The second lower protection layer PS4 may expose the second lower conductive pads 52RP and 52DP. For example, the second lower protection layer PS4 may include openings to expose the second lower conductive pads 52RP and 52DP. The fourth body layer C4 may be formed of or include the same or similar material as the first to third body layers C1 to C3. In an embodiment of the inventive concept, the fourth body layer C4 may be formed of or include silicon. The second upper and lower protection layers PS3 and PS4 may be formed of or include the same material as the first upper and lower protection layers PS1 and PS2. In the present embodiment, the second substrate 200 may be referred to as an interposer substrate.

Inner solder balls ISB may be disposed between the first substrate 100 and the second substrate 200. The inner solder balls ISB may be disposed in the first mold layer MD1. When viewed in the plan view of FIG. 1, the inner solder balls ISB may be arranged to enclose the first semiconductor device CH1. For example, the inner solder balls ISB may surround the first semiconductor device CH1. The first semiconductor device CH1 may include first to fourth chip sidewalls CW1 to CW4 disposed in a clockwise direction, when viewed in a plan view. The first substrate 100 may include first to fourth substrate sidewalls SW1 to SW4 disposed in the clockwise direction, when viewed in a plan view. The first to fourth substrate sidewalls SW1 to SW4 may be adjacent to the first to fourth chip sidewalls CW1 to CW4, respectively.

The first and third chip sidewalls CW1 and CW3 and the first and third substrate sidewalls SW1 and SW3 may be parallel to a second direction D2. The second and fourth chip sidewalls CW2 and CW4 and the second and fourth substrate sidewalls SW2 and SW4 may be parallel to the first direction D1 that is orthogonal to the second direction D2. The inner solder balls ISB may be arranged adjacent to the first chip sidewall CW1 to form m rows parallel to the second direction D2. The inner solder balls ISB may be arranged adjacent to the second chip sidewall CW2 to form n columns parallel to the first direction D1. The numbers m and n are natural numbers and may be equal to or different from each other. In the present embodiment, the numbers m and n may be 2 and 3, respectively.

The inner solder balls ISB may include substrate connection solder balls CSB and support solder balls SSB. Each of the support solder balls SSB may include a core CR, which is an internal portion thereof. Each of the support solder balls SSB may further include a solder layer SL, which encapsulates or encloses the core CR. There may be no core in the substrate connection solder balls CSB. The substrate connection solder balls CSB may be formed of only a solder layer. The support solder balls SSB may be disposed along an edge of the semiconductor package 1000 or adjacent to the first to fourth substrate sidewalls SW1 to SW4, as shown in FIG. 1. For example, the support solder balls SSB may surround the substrate connection solder balls CSB. The support solder balls SSB may be electrically disconnected from the first substrate 100 or the second substrate 200.

Each of the substrate connection solder balls CSB and the solder layer SL may be formed of or include at least one of tin, lead, silver, aluminum, gold, or nickel. The core CR may have a melting point that is higher than that of the solder layer SL. The core CR may be formed of or include a material which has a higher hardness than the solder layer SL. For example the core CR may have a single- or multi-layered structure, which is formed of or includes at least one of copper, aluminum, nickel, stainless steel (SUS), ceramics, or polymer.

Figure 3A:
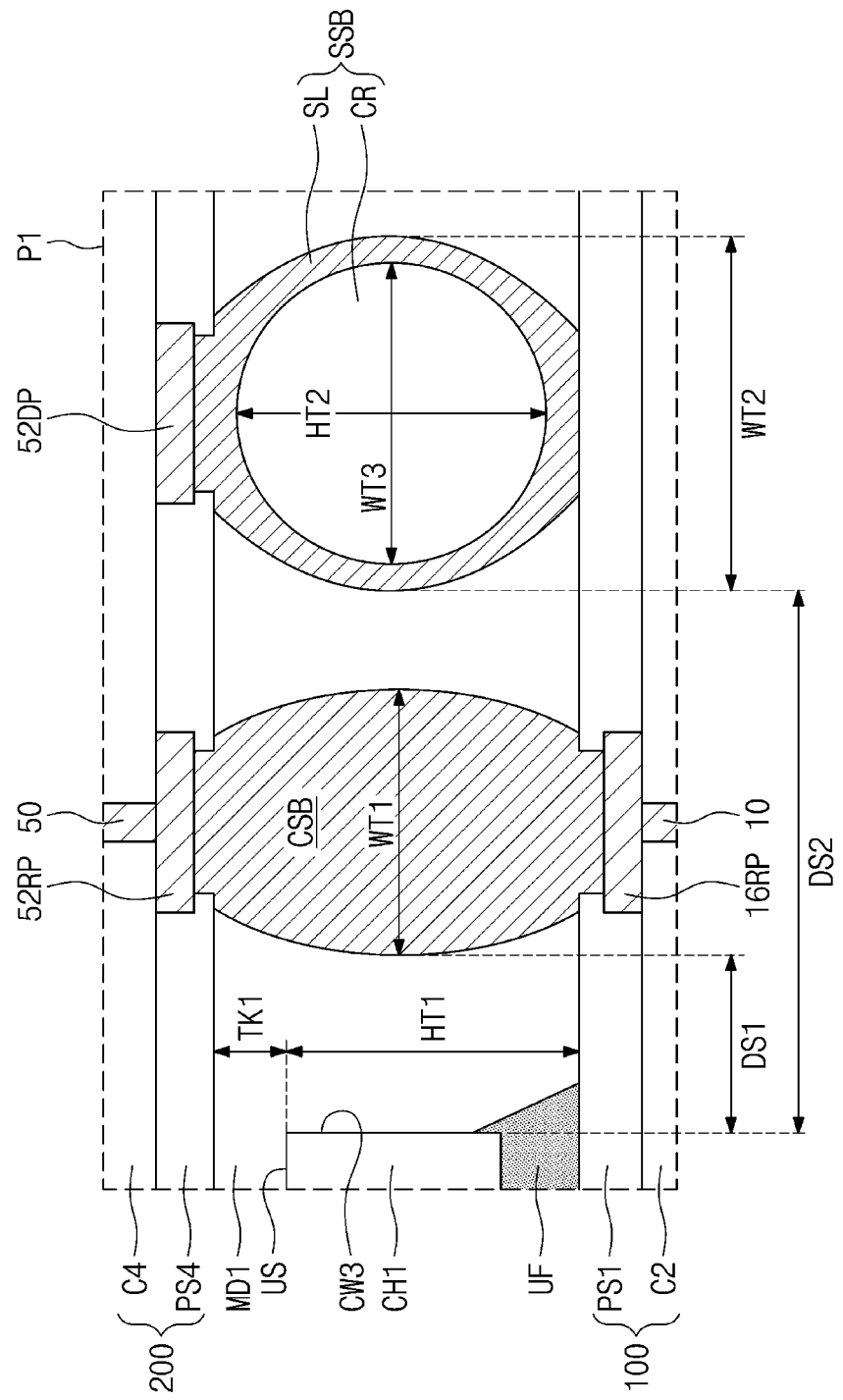
FIGS. 3A, 3B, 3C, 3D and 3E are enlarged sectional views, each of which illustrates a portion 'P1' of FIG. 2.

Referring to FIGS. 2 and 3A, the substrate connection solder balls CSB may be disposed between the first semiconductor device CH1 and the support solder balls SSB. The substrate connection solder ball CSB may be spaced apart from the third chip sidewall CW3 of the first semiconductor device CH1 by a first distance DS1. The support solder ball SSB may be spaced apart from the third chip sidewall CW3 of the first semiconductor device CH1 by a second distance DS2. The first distance DS1 may be smaller than the second distance DS2. The largest width of the substrate connection solder ball CSB may be a first width WT1. The largest width of the support solder ball SSB may be a second width WT2. In an embodiment of the inventive concept, the second width WT2 may be equal to or larger than the first width WT1. The core CR may have a third width WT3. The third width WT3 may be smaller than the second width WT2.

A top surface US of the first semiconductor device CH1 may be covered with the first mold layer MD1. The top surface US of the first semiconductor device CH1 may have a first height HT1, when measured from a top surface of the first upper protection layer PS1. The first mold layer MD1 may have a first thickness TK1, on the top surface US of the first semiconductor device CH1. In other words, the first mold layer MD1 may have the first thickness TK1 between the top surface US of the first semiconductor device CH1 and the bottom of the second lower protection layer PS4. In an embodiment of the inventive concept, the first thickness TK1 may range from 10 μm to 50 μm. The core CR may have a second height HT2. The second height HT2 may be greater than the first height HT1. In an embodiment of the inventive concept, a difference between the second height HT2 and the first height HT1 may range from 10 μm to 50 μm.

The substrate connection solder balls CSB may connect the first substrate connection pad 16RP to the second substrate connection pad 52RP and may be in direct contact with each of the first substrate connection pad 16RP and the second substrate connection pad 52RP. The first substrate connection pad 16RP may be connected to the first via 10, and the second substrate connection pad 52RP may be connected to the second via 50. The first substrate connection pad 16RP may serve as an electrical signal transmission path between the first substrate 100 and the second substrate 200.

A bottom surface of the support solder ball SSB may be in contact with the first upper protection layer PS1 of the first substrate 100. A top surface of the support solder ball SSB may be in contact with the dummy conductive pad 52DP. For example, the support solder ball SSB may directly contact the dummy conductive pad 52DP. The dummy conductive pad 52DP may not be connected to the second via 50. Any electrical signal may not be applied to the dummy conductive pad 52DP, and in an embodiment of the inventive concept, the dummy conductive pad 52DP may be used for bonding with the support solder ball SSB. The support solder ball SSB may not serve as the electrical signal transmission path between the first substrate 100 and the second substrate 200. As shown in FIG. 3A, a bottom portion of the core CR may be spaced apart from the top surface of the first upper protection layer PS1 by the solder layer SL. The solder layer SL between the bottom portion of the core CR and the top surface of the first upper protection layer PS1 may directly contact the top surface of the first upper protection layer PS1. A top portion of the core CR may be spaced apart from a bottom surface of the dummy conductive pad 52DP by the solder layer SL.

Since the first semiconductor device CH1 is placed at a center of the semiconductor package 1000, warpage may not occur at the center of the semiconductor package 1000. However, the larger the distance from the first semiconductor device CH1, the more warpage may occur. According to an embodiment of the inventive concept, since the support solder balls SSB are placed at the edge of the semiconductor package 1000, which is most vulnerable to warpage, it is possible to prevent or suppress warpage from occurring in the semiconductor package 1000. In addition, during the process of fabricating the semiconductor package 1000, the support solder balls SSB may be used to support the second substrate 200 or to prevent the second substrate 200 from being excessively compressed, and thus, it is possible to prevent a short circuit from occurring between the inner solder balls ISB and to prevent or suppress the second substrate 200 from being laterally deviated. As a result, it is possible to prevent a product failure and to increase the reliability of the semiconductor package 1000.

Figure 3B:
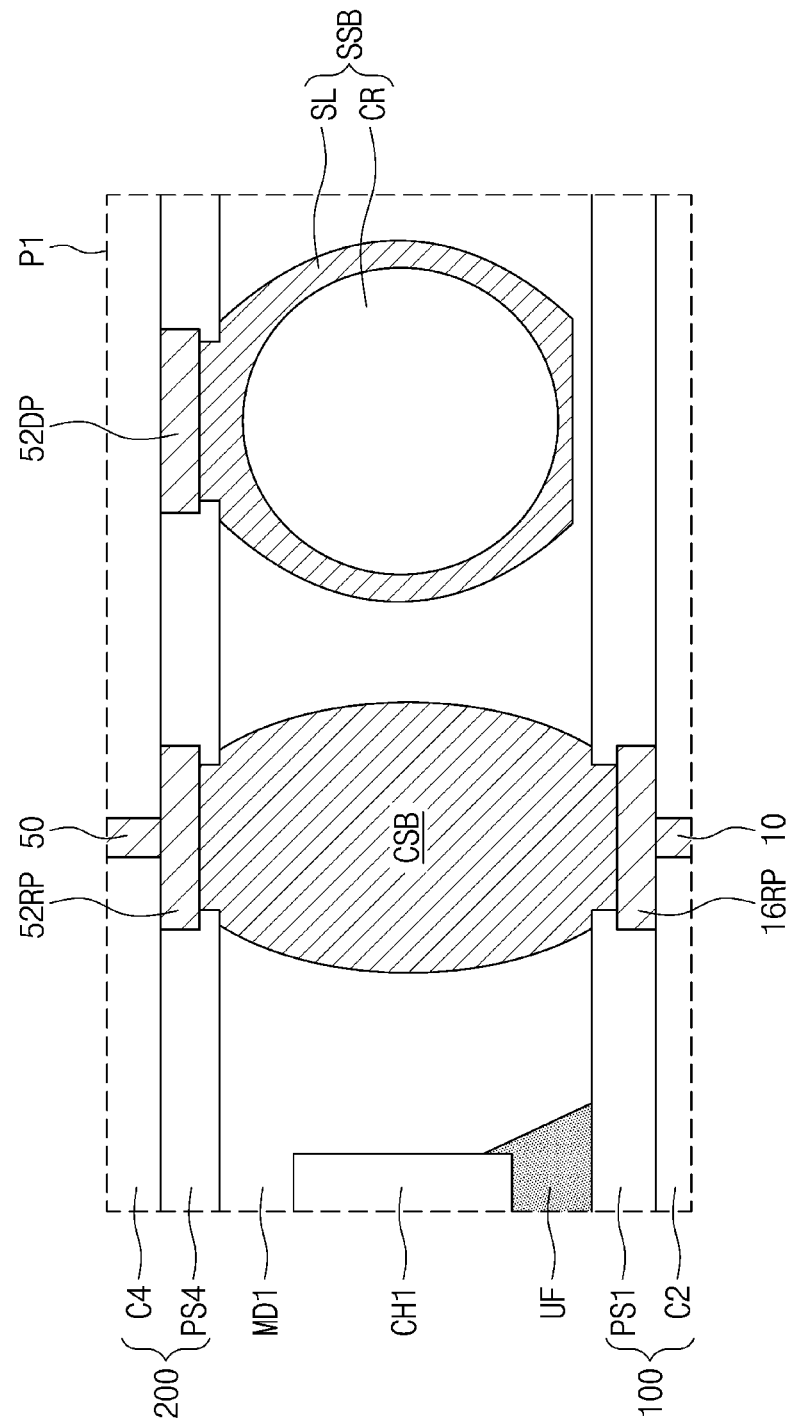

The solder layer SL of the support solder ball SSB may have a high adhesive strength on a surface of the same or similar metallic material but may have a low adhesive strength on a nonmetallic material (e.g., a polymer material, such as epoxy). In other words, the support solder ball SSB may be stably bonded to the dummy conductive pad 52DP, but the adhesive strength of the support solder ball SSB to the first upper protection layer PS1 may be low. Thus, the bottom surface of the support solder ball SSB may be spaced apart from the first upper protection layer PS1, as shown in FIG. 3B. In this case, the bottom surface of the support solder ball SSB may be flat. In addition, the first mold layer MD1 may be interposed between the first upper protection layer PS1 and the support solder ball SSB.

Figure 3C:
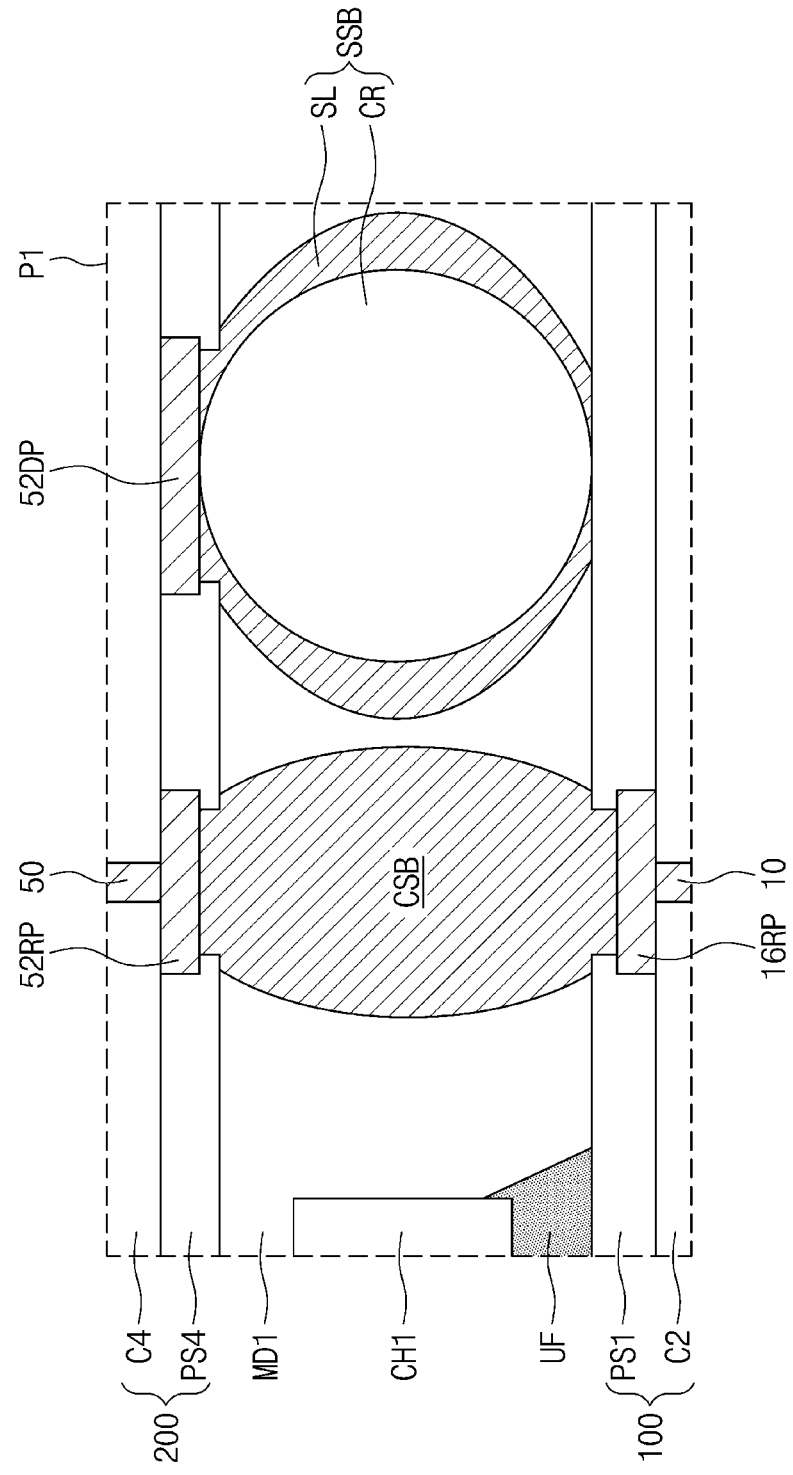

In certain embodiments of the inventive concept, as shown in FIG. 3C, the bottom portion of the core CR of the support solder ball SSB may be in contact with the top surface of the first upper protection layer PS1, and the top portion of the core CR may be in contact with the dummy conductive pad 52DP. For example, a first gap may exist in the solder layer SL to permit the bottom portion of the core CR to contact the first upper protection layer PS1, and a second gap may exist in the solder layer SL to permit the top portion of the core CR to contact the dummy conductive pad 52DP.

Figure 3D:
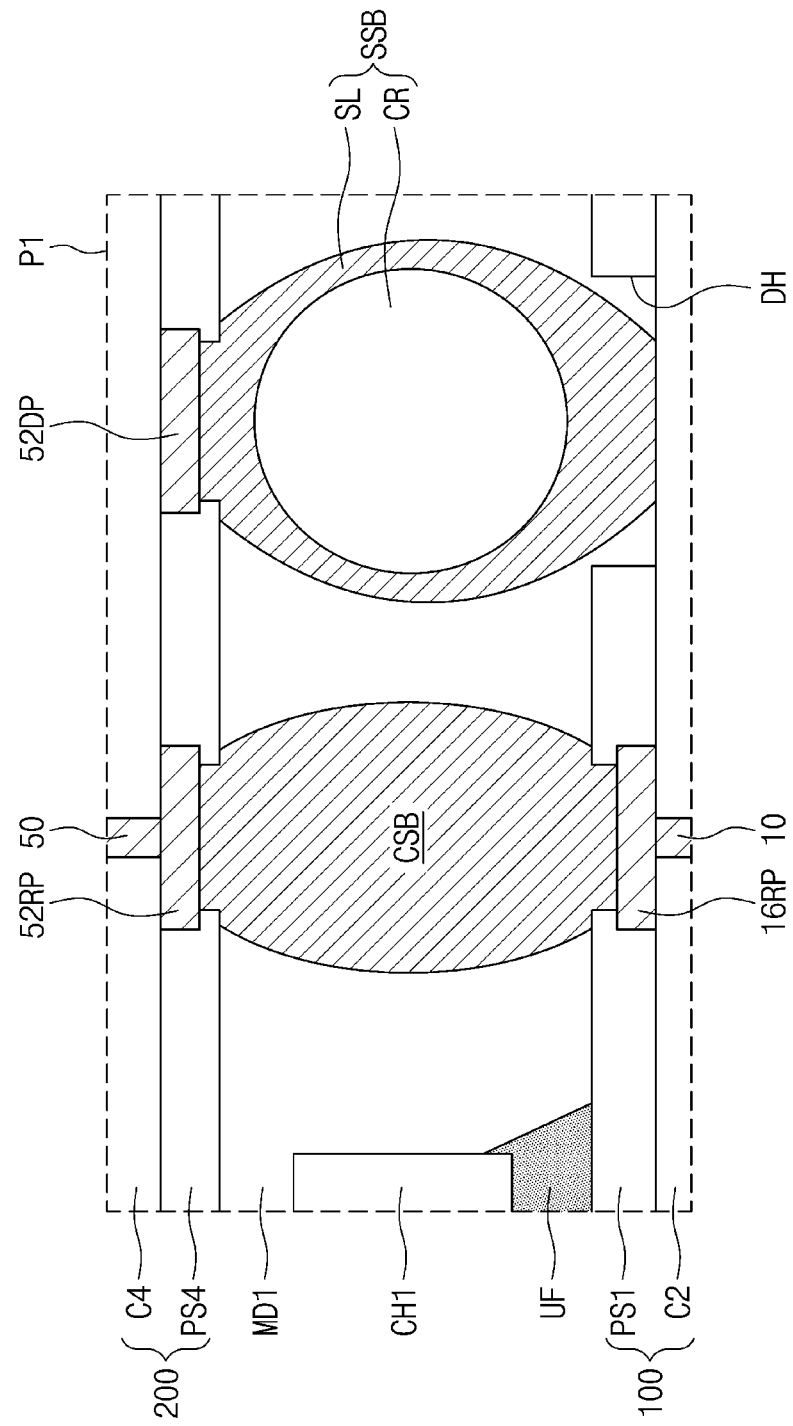

In certain embodiments of the inventive concept, as shown in FIG. 3D, the first upper protection layer PS1 may include a dummy hole DH exposing the second body layer C2. A portion of the support solder ball SSB may be in contact with the second body layer C2 through the dummy hole DH.

Figure 3E:
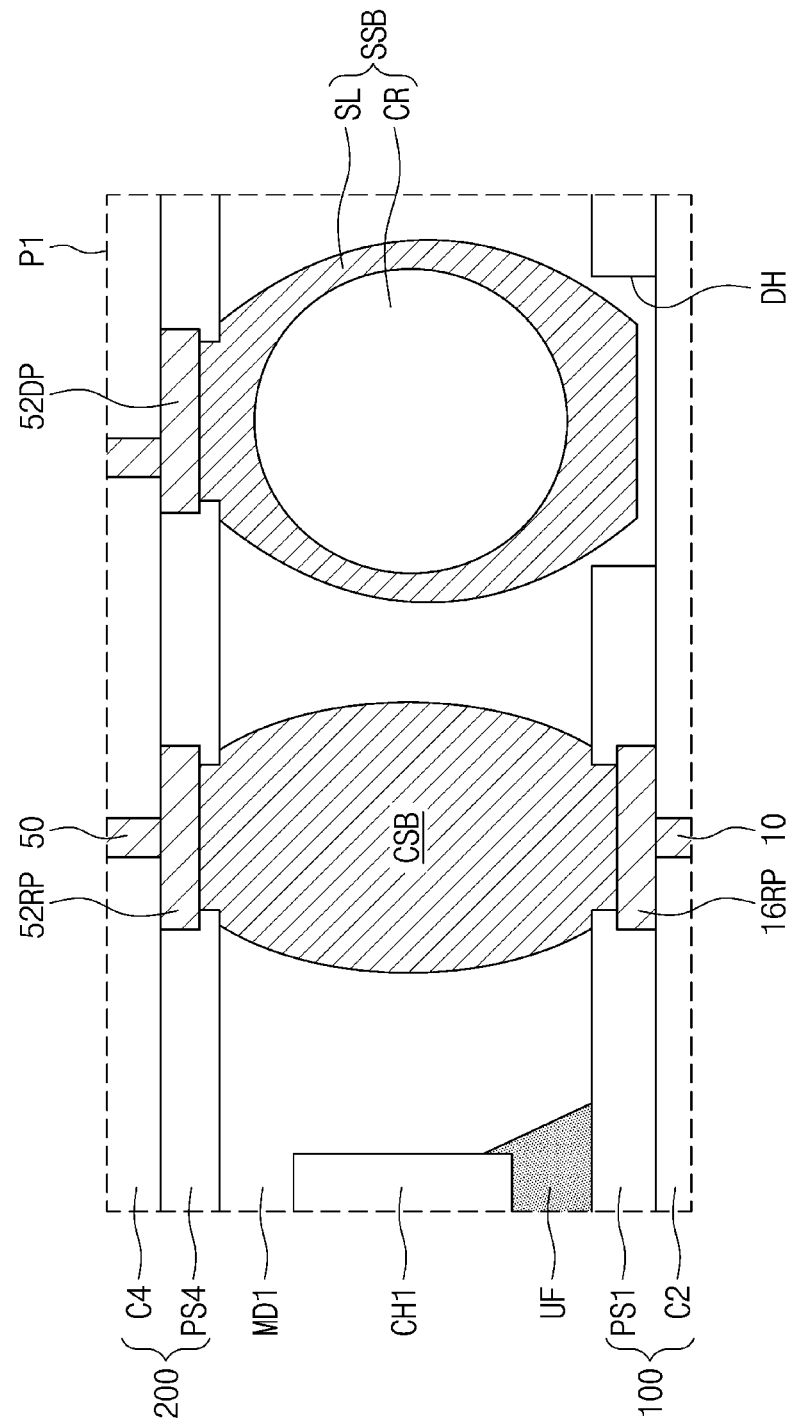

In certain embodiments of the inventive concept, as shown in FIG. 3E, the support solder ball SSB may be spaced apart from the second body layer C2, and the first mold layer MD1 may be interposed between the second body layer C2 and the support solder ball SSB and may cover a sidewall of the dummy hole DH.

Figure 4:
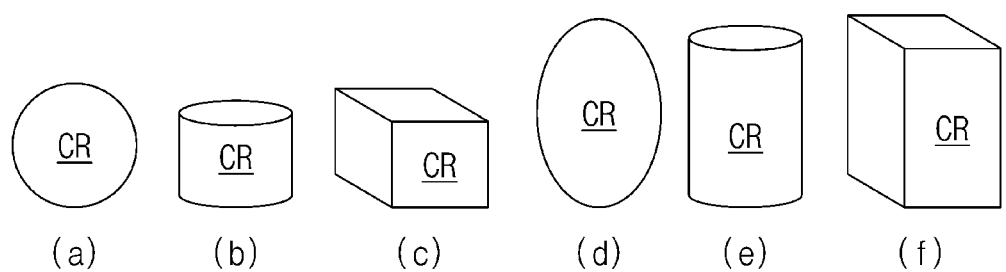
FIG. 4 illustrates various shapes of a core according to an embodiment of the inventive concept.
Figure 4:
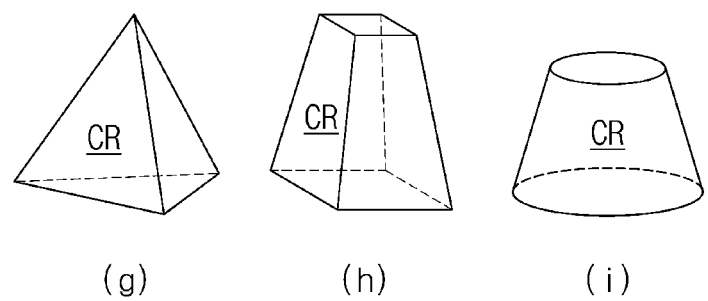

FIG. 4 illustrates various shapes of a core according to an embodiment of the inventive concept.

Referring to FIG. 4, the core CR may have a spherical shape as shown in (a), a short circular pillar shape as shown in (b), a cube shape as shown in (c), an ellipsoid shape as shown in (d), a circular pillar shape as shown in (e), a rectangular parallelepiped shape as shown in (f), a regular tetrahedron shape as shown in (g), or a pillar shape having a bottom surface wider than a top surface, as shown in (h) and (i). In the case where, as shown in (b), (c), (e), (f), (h), and (i), the core CR has a structure whose top and bottom surfaces are parallel to each other, the second substrate 200 may be more effectively supported by the core CR. In addition, a distance between the first substrate 100 and the second substrate 200 may be adjusted by changing the second height HT2 of the core CR. In the case where, as shown in (g), (h), and (i), the bottom surface is wider than the top surface, it is possible to stably support the second substrate 200 without the core CR collapsing. By adjusting the shape of the core CR, it is possible to prevent a short circuit from being formed between the inner solder balls ISB and to increase the reliability of the semiconductor package 1000. In an embodiment of the inventive concept, the support solder ball SSB may include the core CR, which has one of the shapes shown in FIG. 4, and the solder layer SL, which coats a surface of the core CR.

Figure 5A:
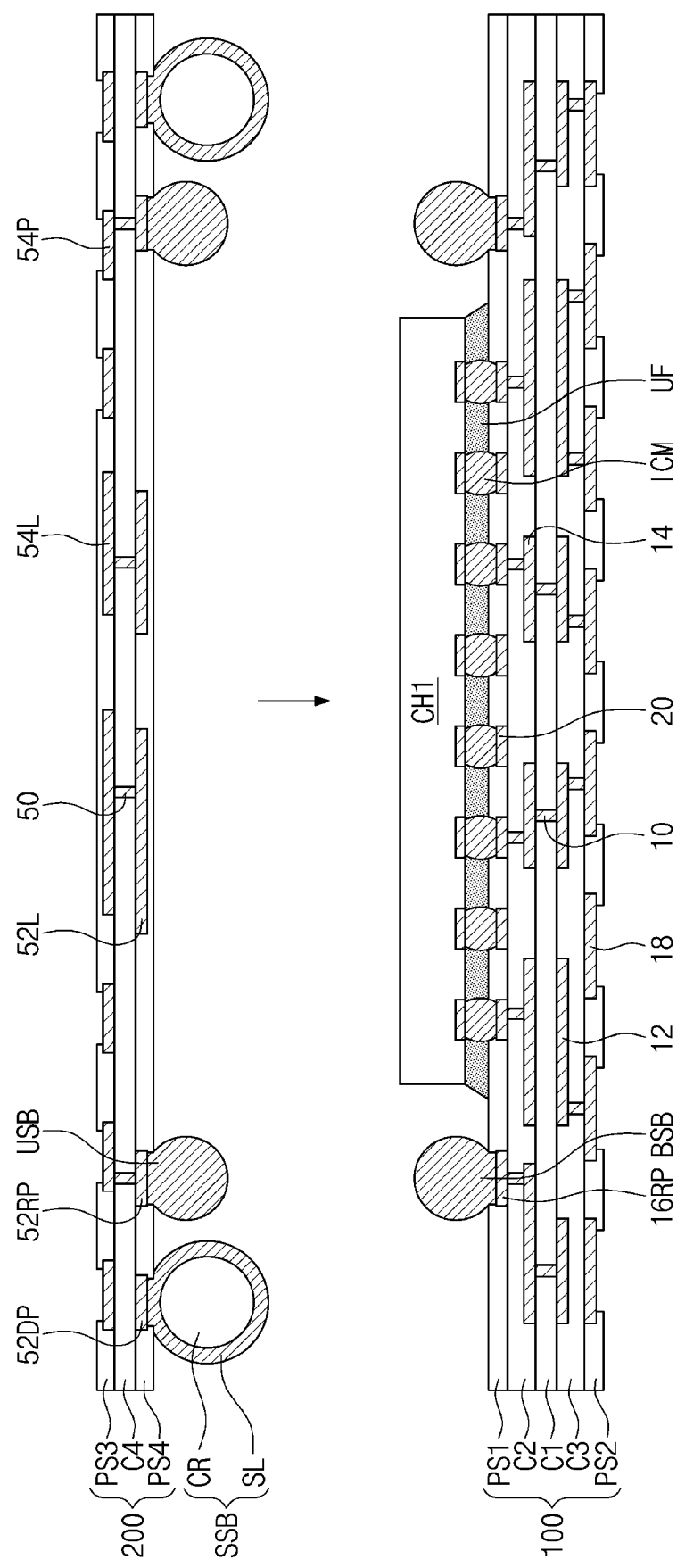
FIGS. 5A and 5B are diagrams illustrating a process of fabricating the semiconductor package of FIG. 2.
Figure 5B:
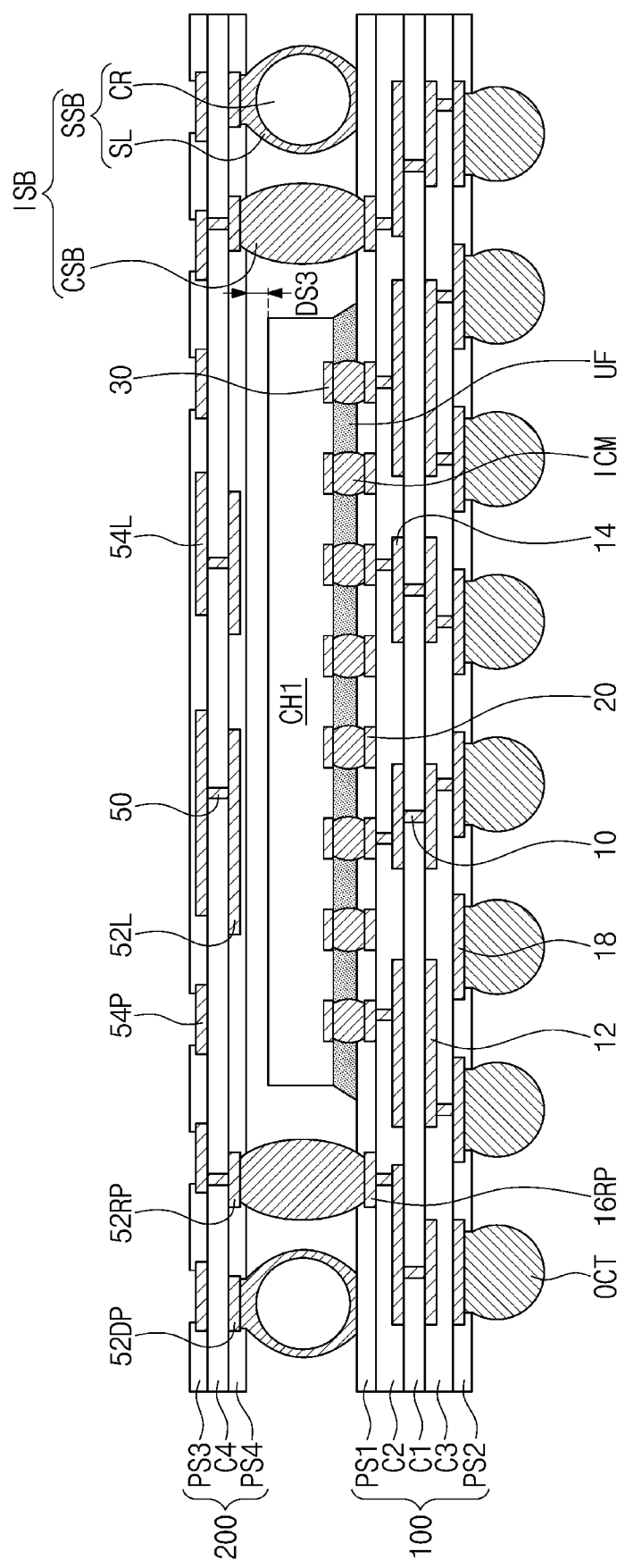

FIGS. 5A and 5B are diagrams illustrating a process of fabricating the semiconductor package of FIG. 2.

Referring to FIG. 5A, the first substrate 100, to which the outer connection terminal OCT is not bonded, may be prepared, and here, the first substrate 100 may have the same structure as shown in FIG. 2, except for the outer connection terminal OCT. The first semiconductor device CH1 may be bonded to the first substrate 100, in a flip-chip bonding manner, using the first inner connection member ICM. The under-fill layer UF may be formed between the first substrate 100 and the first substrate 100. A first connection solder ball BSB may be bonded to the first substrate connection pad 16RP of the first substrate 100.

The second substrate 200 may be prepared. A second connection solder ball USB may be bonded to the second substrate connection pad 52RP of the second substrate 200. In addition, the support solder ball SSB may be bonded to the dummy conductive pad 52DP of the second substrate 200. A size of the support solder ball SSB may be larger than a size of each of the first and second connection solder balls BSB and USB.

Referring to FIGS. 5A and 5B, a flux agent may coat surfaces of the support solder ball SSB and the first and second connection solder balls BSB and USB. Next, the second substrate 200 may be placed on the first substrate 100 such that the first and second connection solder balls BSB and USB are in contact with each other, and then, a thermal compression bonding process of melting and merging the first and second connection solder balls BSB and USB may be performed to form the substrate connection solder ball CSB of FIG. 2. During this process, the solder layer SL of the support solder ball SSB may be melted and may be bonded to the first upper protection layer PS1. The flux agent may be used to remove a metal oxide layer from surfaces of the support solder ball SSB and the first and second connection solder balls BSB and USB.

Since, in the thermal compression bonding process, the core CR in the support solder ball SSB has a better resistant property to heat and pressure than the solder layer SL, the second substrate 200 may be effectively supported by the core CR, and thus, it is possible to prevent the second substrate 200 from being excessively compressed or to prevent or suppress the second substrate 200 from being laterally deviated. Accordingly, as described above, it is possible to prevent warpage from occurring in the semiconductor package 1000 and to prevent a short circuit from occurring between the inner solder balls ISB. As a result, it is possible to increase the reliability of the semiconductor package 1000.

In addition, since the second height HT2 of the core CR (e.g., see FIG. 3A) is larger than the first height HT1 of the top surface US of the first semiconductor device CH1 (e.g., see FIG. 3A), a specific distance DS3 between the second substrate 200 and the first semiconductor device CH1 may be unchanged after the bonding process, as shown in FIG. 5B. Thereafter, a cleaning process may be performed to remove the flux agent left on the surfaces of the support solder ball SSB and the substrate connection solder balls CSB. Since the specific distance DS3 between the second substrate 200 and the first semiconductor device CH1 is maintained to a constant value, a cleaning solution may be easily supplied into a space between the second substrate 200 and the first semiconductor device CH1 during the cleaning process. Thus, it is possible to effectively remove the flux agent and thereby prevent the first mold layer MD1 from delaminating which may occur when the flux agent is left.

After the thermal compression bonding process, a compressive force exerted on the second substrate 200 may be removed, and then, as shown in FIG. 3B or 3E, after the solder layer SL is solidified, the solder layer SL may be spaced apart from the first upper protection layer PS1 or the second body layer C2 by an adhesive strength which remains between the solder layer SL and the first upper protection layer PS1 or the second body layer C2. Alternatively, if the solder layer SL is solidified while the compressive force is exerted on the second substrate 200, the resulting structure may have the shape of FIG. 3C.

Referring to FIGS. 2 and 3A, the first mold layer MD1 may be formed between the first substrate 100 and the second substrate 200, after the thermal compression bonding process. Thereafter, a singulation process may be performed to separate the semiconductor package 1000 from another semiconductor package. Since the specific distance DS3 between the second substrate 200 and the first semiconductor device CH1 is unchanged, the first mold layer MD1 between the first semiconductor device CH1 and the second substrate 200 may have a constant thickness TK1 (e.g., see FIG. 3A). Thus, it is possible to increase a flatness property of the semiconductor package 1000, to suppress a warpage phenomenon, to reduce a shift issue, and thereby increase the reliability of the semiconductor package 1000.

Solder balls according to the conventional technology do not include the core, and thus, in the conventional technology, thermal compression bonding may not achieve intended results. In this case, a first substrate and a second substrate may be misaligned to each other; in other words, a shift issue may occur. In order to maintain a distance between the second substrate and the first semiconductor device to a constant value, a support patch may be provided on a top surface of the first semiconductor device, but even in this case, due to the presence of the support patch, the cleaning solution may not be appropriately supplied into a space between the second substrate and the first semiconductor device. Thus, the flux agent may not be clearly removed, and a remaining flux agent may result in delamination of the mold layer. However, since, according to an embodiment of the inventive concept, the specific distance DS3 between the second substrate 200 and the first semiconductor device CH1 is maintained by the support solder ball SSB with the core CR, the support patch is not required. Thus, it is possible to omit a process of forming the support patch and to simplify a fabrication process.

Figure 6:
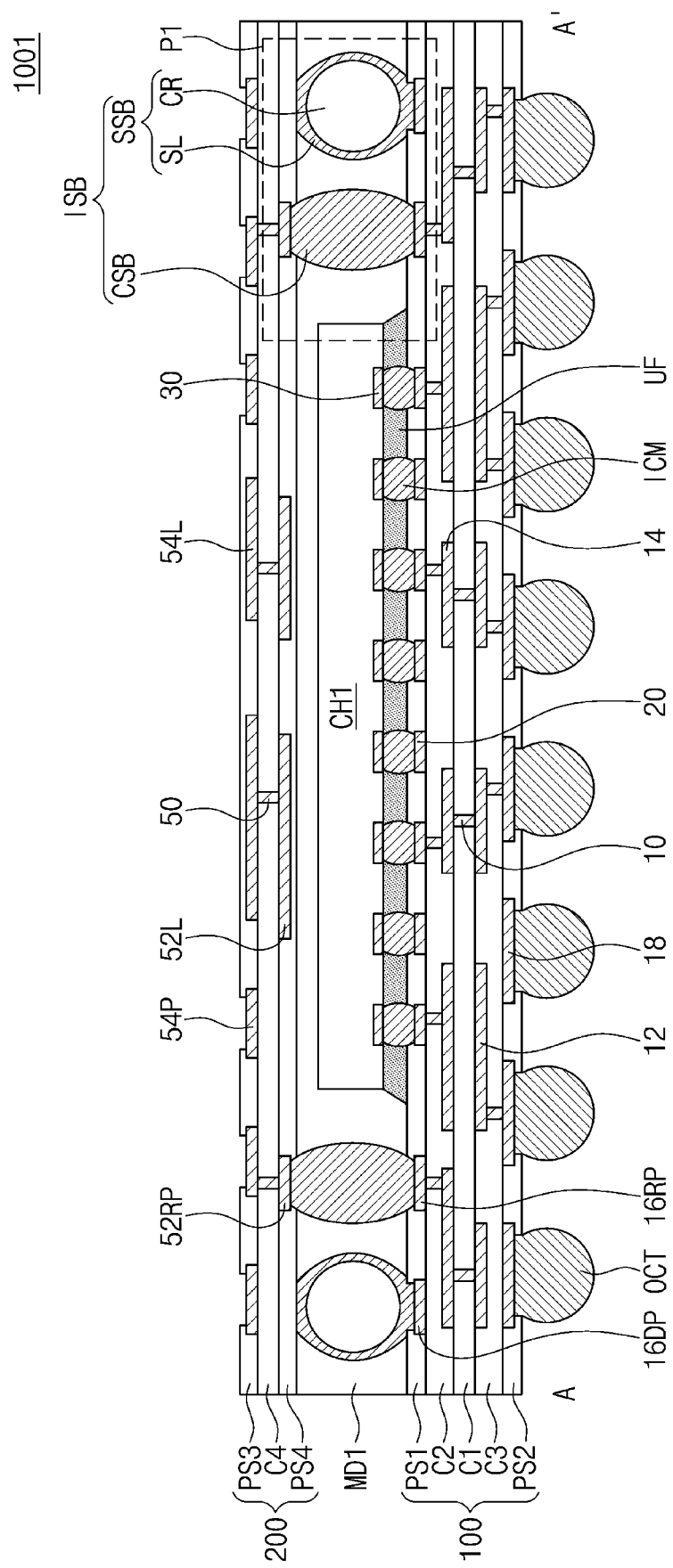
FIG. 6 is a sectional view taken along the line A-A' of FIG. 1.

FIG. 6 is a sectional view taken along the line A-A' of FIG. 1. FIGS. 7A to 7E are enlarged sectional views, each of which illustrates a portion 'P1' of FIG. 6.

Figure 7A:
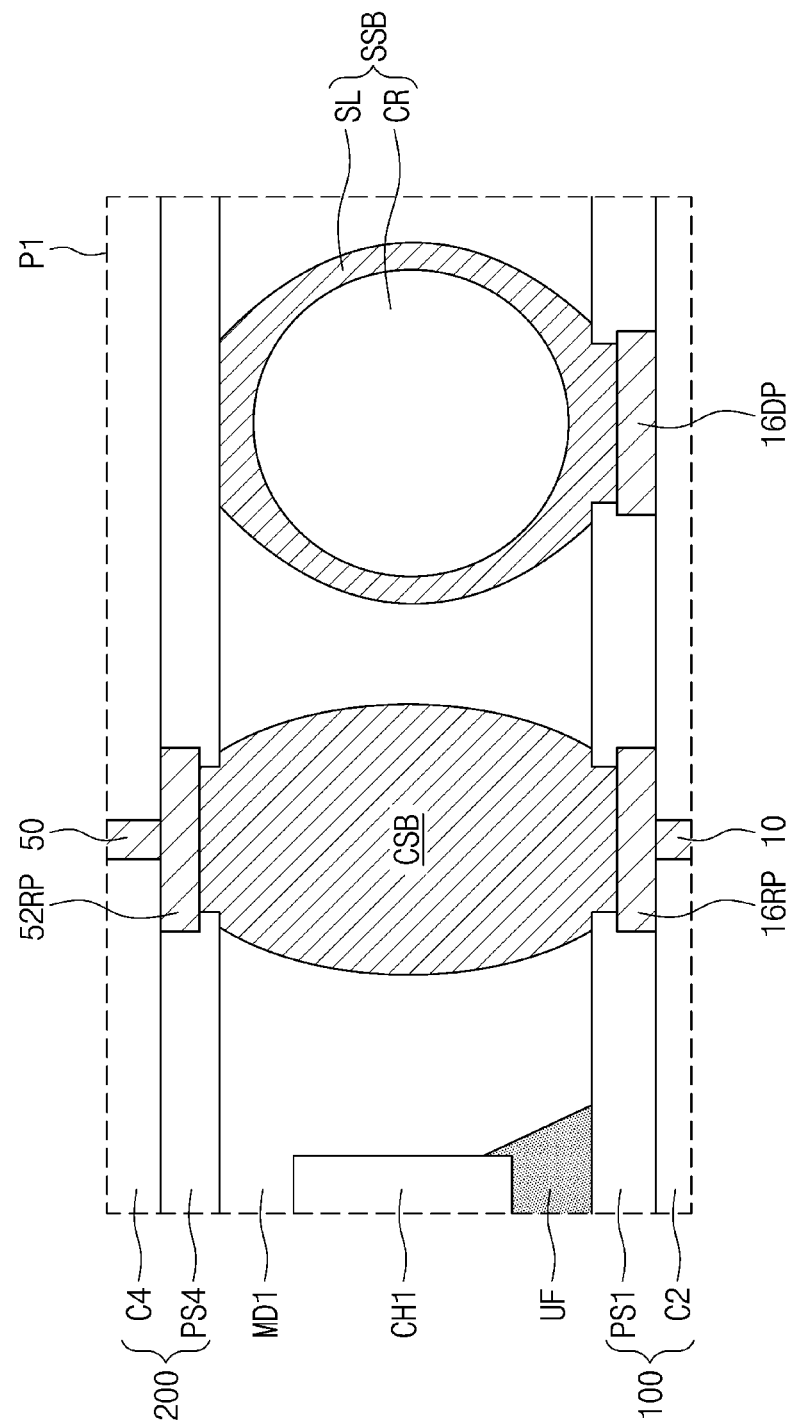
FIGS. 7A, 7B, 7C, 7D and 7E are enlarged sectional views, each of which illustrates a portion 'P1' of FIG. 6.

Referring to FIGS. 6 and 7A, in a semiconductor package 1001 according to the present embodiment, the second substrate 200 may not include the dummy conductive pad 52DP. The first substrate 100 may include a dummy conductive pad 16DP disposed on the second body layer C2. The support solder ball SSB may penetrate the first upper protection layer PS1 on the second body layer C2 to be in contact with the dummy conductive pad 16DP. The dummy conductive pad 16DP may not be connected to the first vias 10. The dummy conductive pad 16DP may be used for the bonding of the support solder ball SSB, not for a transmission path of an electrical signal.

The support solder ball SSB may be in contact with a bottom surface of the second lower protection layer PS4 of the second substrate 200. The top portion of the core CR in the support solder ball SSB may be spaced apart from the bottom surface of the second lower protection layer PS4 by the solder layer SL. The bottom portion of the core CR in the support solder ball SSB may be spaced apart from the top surface of the dummy conductive pad 16DP by the solder layer SL. Except for these differences, the semiconductor package 1001 according to the present embodiment may be configured to have the same or similar features as the semiconductor package 1000 of the previous embodiment described with reference to FIGS. 2 and 3A.

Figure 7B:
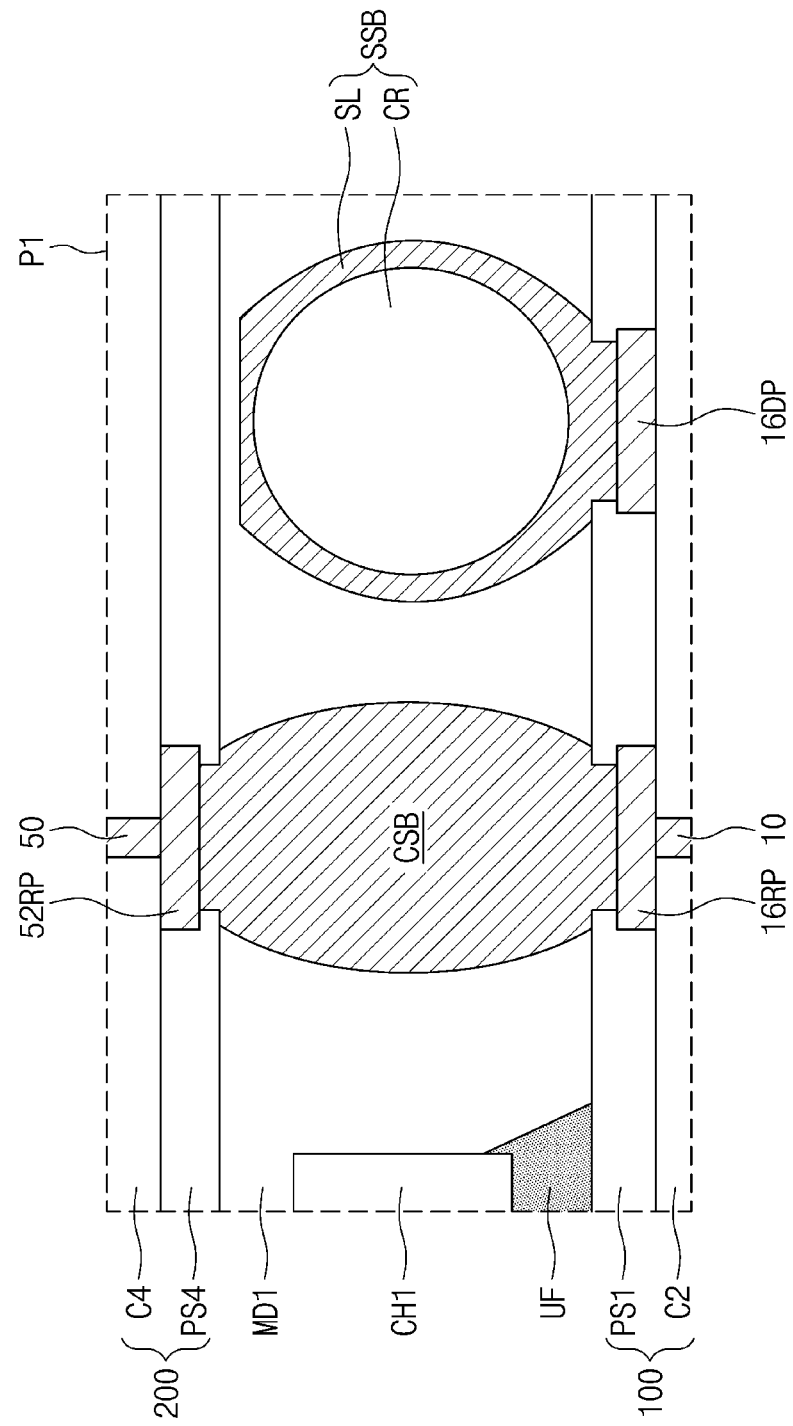

In certain embodiments of the inventive concept, as shown in FIG. 7B, the top surface of the support solder ball SSB may be spaced apart from the bottom surface of the second lower protection layer PS4. The top surface of the support solder ball SSB may be flat. The first mold layer MD1 may be interposed between the bottom surface of the second lower protection layer PS4 and the support solder ball SSB.

Figure 7C:
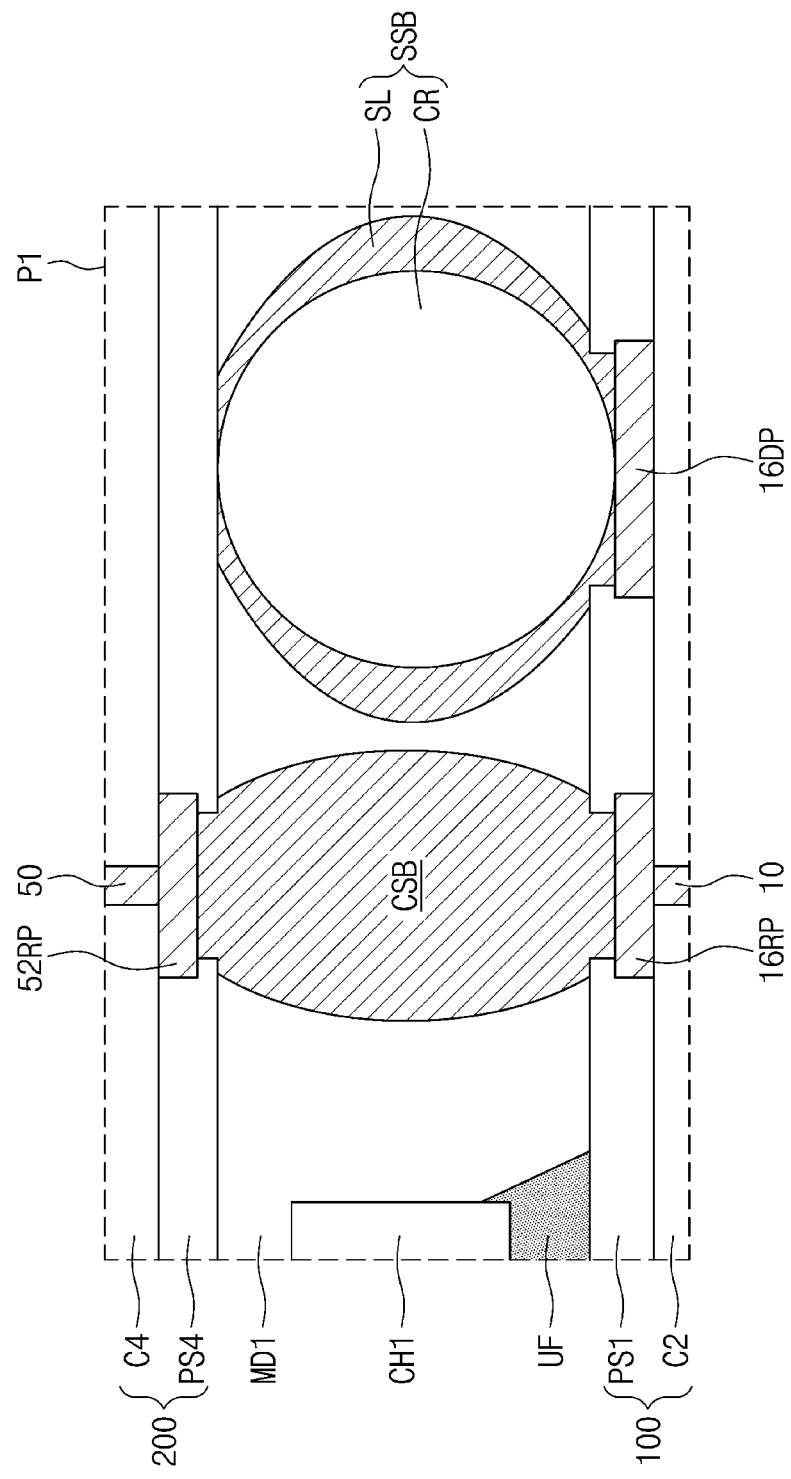

In certain embodiments of the inventive concept, as shown in FIG. 7C, a bottom portion of the core CR of the support solder ball SSB may be in contact with the top surface of the dummy conductive pad 16DP, and a top portion of the core CR may be in contact with a bottom surface of the second lower protection layer PS4. In other words, the core CR may be in direct contact with both of the dummy conductive pad 16DP and the second lower protection layer PS4.

Figure 7D:
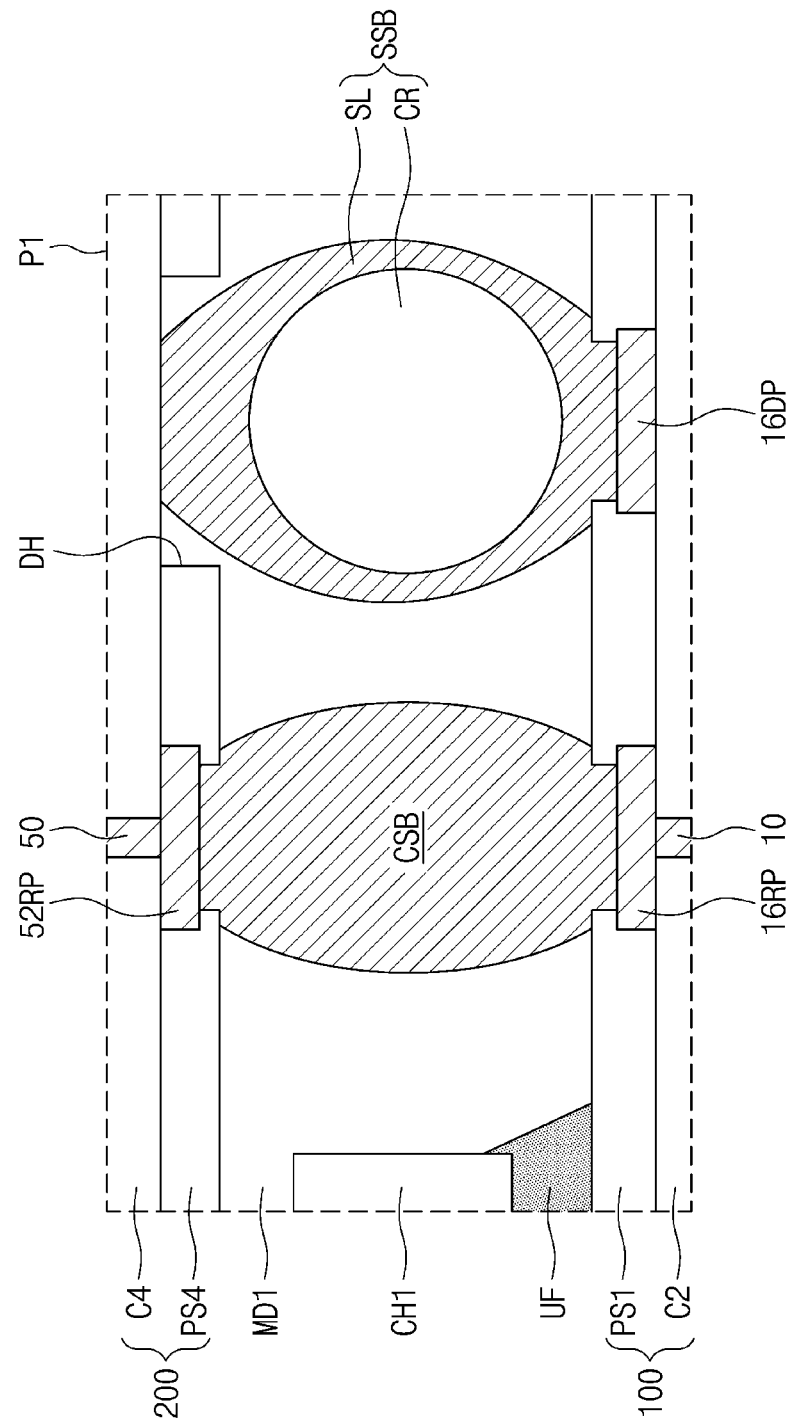

In certain embodiments of the inventive concept, as shown in FIG. 7D, the second lower protection layer PS4 may include the dummy hole DH exposing the fourth body layer C4 of the second substrate 200. A portion of the support solder ball SSB may be in contact with the fourth body layer C4 of the second substrate 200 through the dummy hole DH.

Figure 7E:
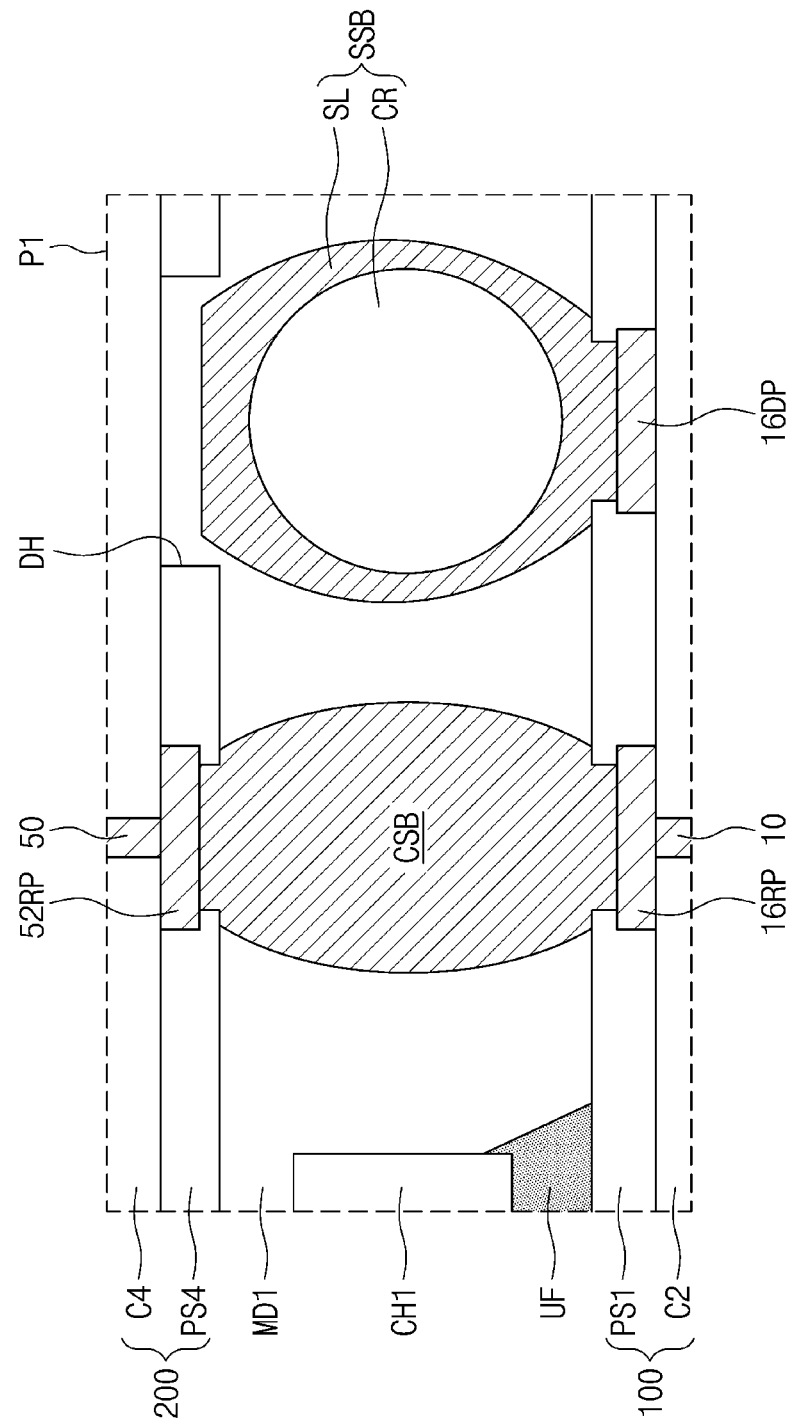

In certain embodiments of the inventive concept, as shown in FIG. 7E, the support solder ball SSB may be spaced apart from the fourth body layer C4 of the second substrate 200, and the first mold layer MD1 may be interposed between the fourth body layer C4 of the second substrate 200 and the support solder ball SSB to cover the sidewall of the dummy hole DH.

Figure 8:
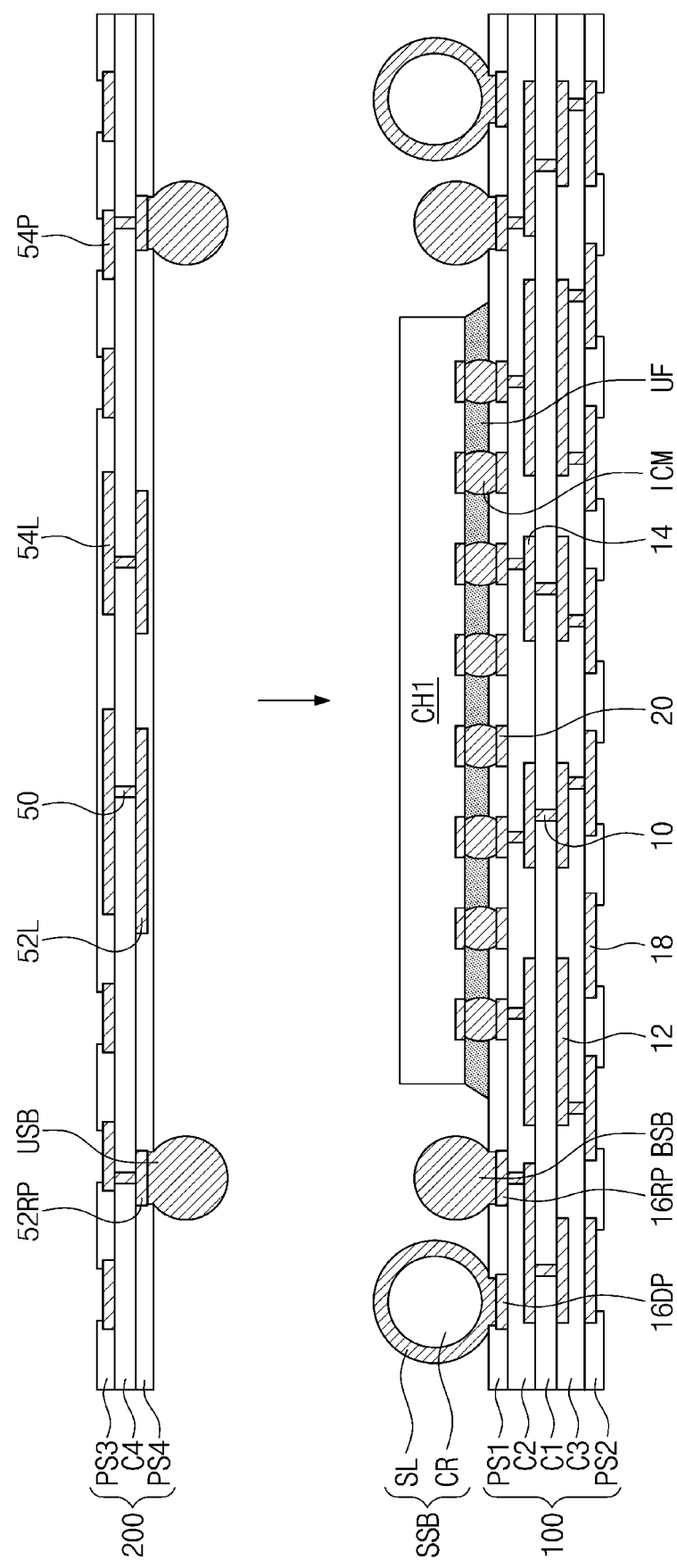
FIG. 8 is a diagram illustrating a method of fabricating the semiconductor package of FIG. 6.

FIG. 8 is a diagram illustrating a method of fabricating the semiconductor package of FIG. 6.

Referring to FIG. 8, the first substrate 100, to which the outer connection terminal OCT is not bonded, may be prepared. In this case, the first substrate 100 may have the same structure as shown in FIG. 6, except for the outer connection terminal OCT. The first semiconductor device CH1 may be bonded to the first substrate 100, in a flip-chip bonding manner, using the first inner connection member ICM. The under-fill layer UF may be formed between the first substrate 100 and the first semiconductor device CH1. The first connection solder ball BSB may be bonded to the first substrate connection pad 16RP of the first substrate 100. The support solder ball SSB may be bonded to the dummy conductive pad 16DP of the first substrate 100.

The second substrate 200 may be prepared. The support solder ball SSB may be bonded to the dummy conductive pad 52DP of the second substrate 200. A size of the support solder ball SSB may be larger than a size of each of the first and second connection solder balls BSB and USB.

Next, the second substrate 200 may be placed on the first substrate 100 such that the first and second connection solder balls BSB and USB are in contact with each other, and then, a thermal compression bonding process of melting and merging the first and second connection solder balls BSB and USB may be performed to form the substrate connection solder ball CSB of FIG. 2. At this time, the solder layer SL of the support solder ball SSB may be melted and bonded to the second lower protection layer PS4. Thereafter, the process described with reference to FIGS. 5B and 2 may be performed.

Figure 9:
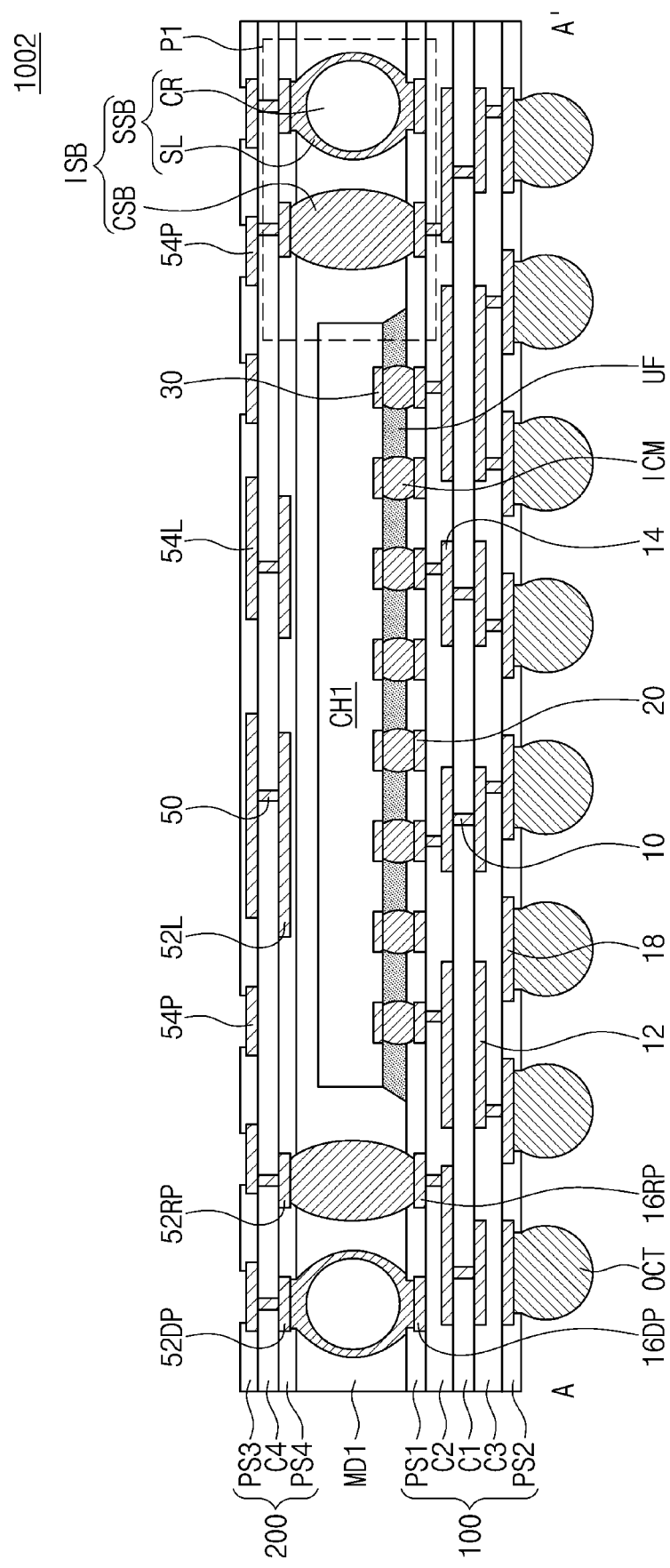
FIG. 9 is a sectional view taken along the line A-A' of FIG. 1.
Figure 10:
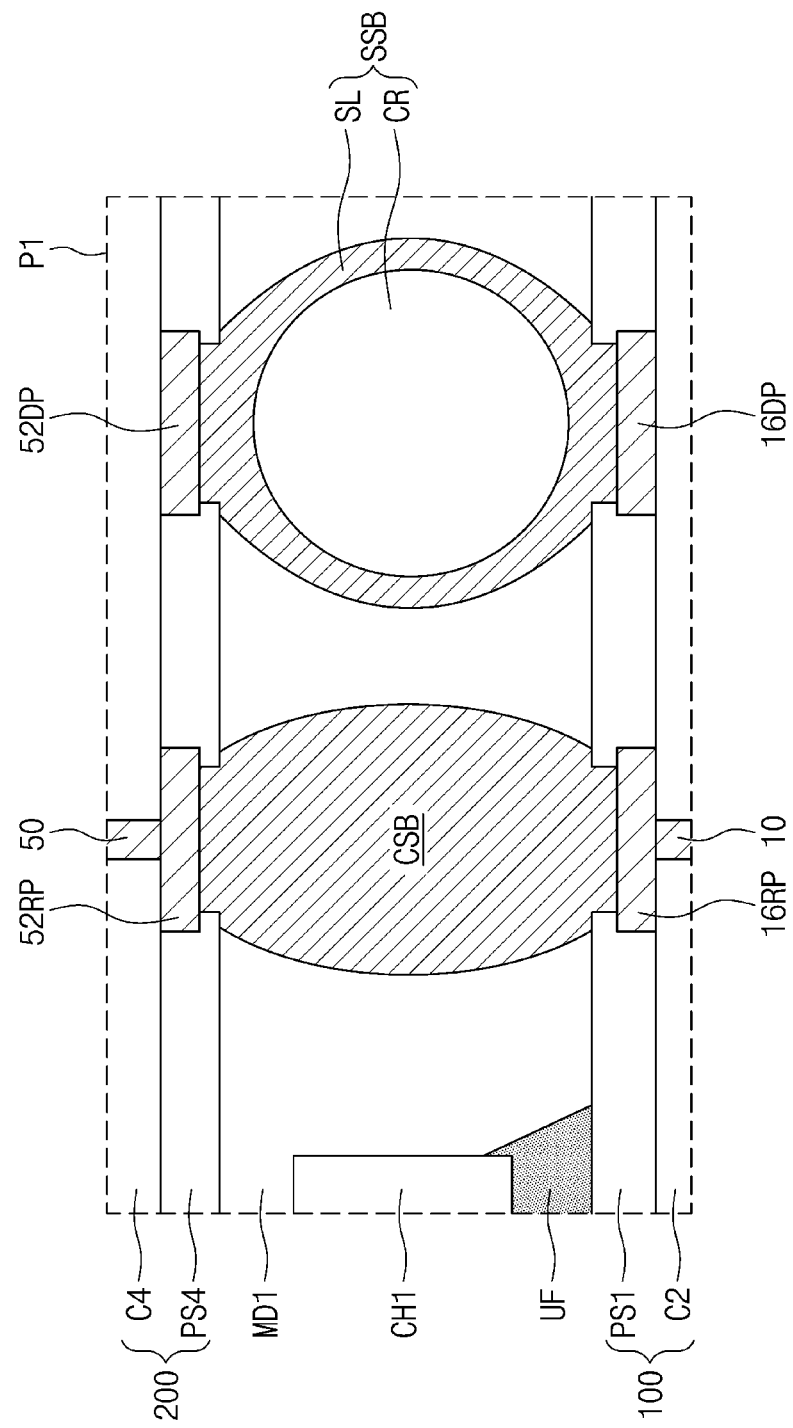
FIG. 10 is an enlarged sectional view illustrating a portion 'P1' of FIG. 9.

FIG. 9 is a sectional view taken along the line A-A' of FIG. 1. FIG. 10 is an enlarged sectional view illustrating a portion 'P1' of FIG. 9.

Referring to FIGS. 9 and 10, in a semiconductor package 1002 according to the present embodiment, the first substrate 100 may include a first dummy conductive pad 16DP on the second body layer C2, and the second substrate 200 may include the second dummy conductive pad 52DP provided on the bottom surface of the fourth body layer C4. The first and second dummy conductive pads 16DP and 52DP may face each other. The support solder ball SSB may penetrate the first upper protection layer PS1 to be in contact with the first dummy conductive pad 16DP and may penetrate the second lower protection layer PS4 to be in contact with the second dummy conductive pad 52DP. The first dummy conductive pad 16DP may not be connected to the first vias 10, and the second dummy conductive pad 52DP may not be connected to the second vias 50. The first dummy conductive pad 16DP and the second dummy conductive pad 52DP may not be used as a transmission path of an electrical signal, but may be used for the bonding of the support solder ball SSB. Except for these differences, the semiconductor package 1002 according to the present embodiment and the fabrication method thereof may be configured to have the same or similar features as the semiconductor packages 1000 and 1001 and the fabrication methods of the previous embodiments described with reference to FIGS. 1 to 8.

Figure 11:
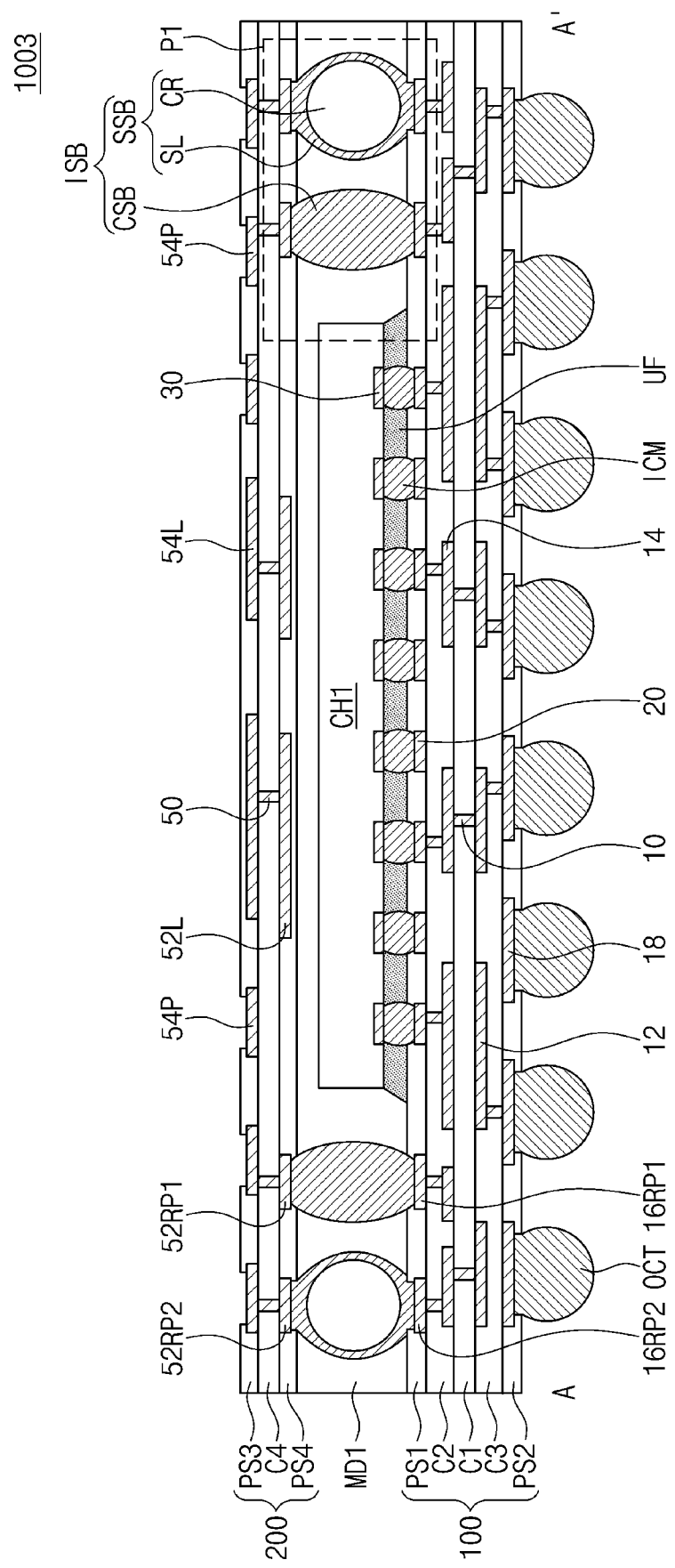
FIG. 11 is a sectional view taken along the line A-A' of FIG. 1.
Figure 12:
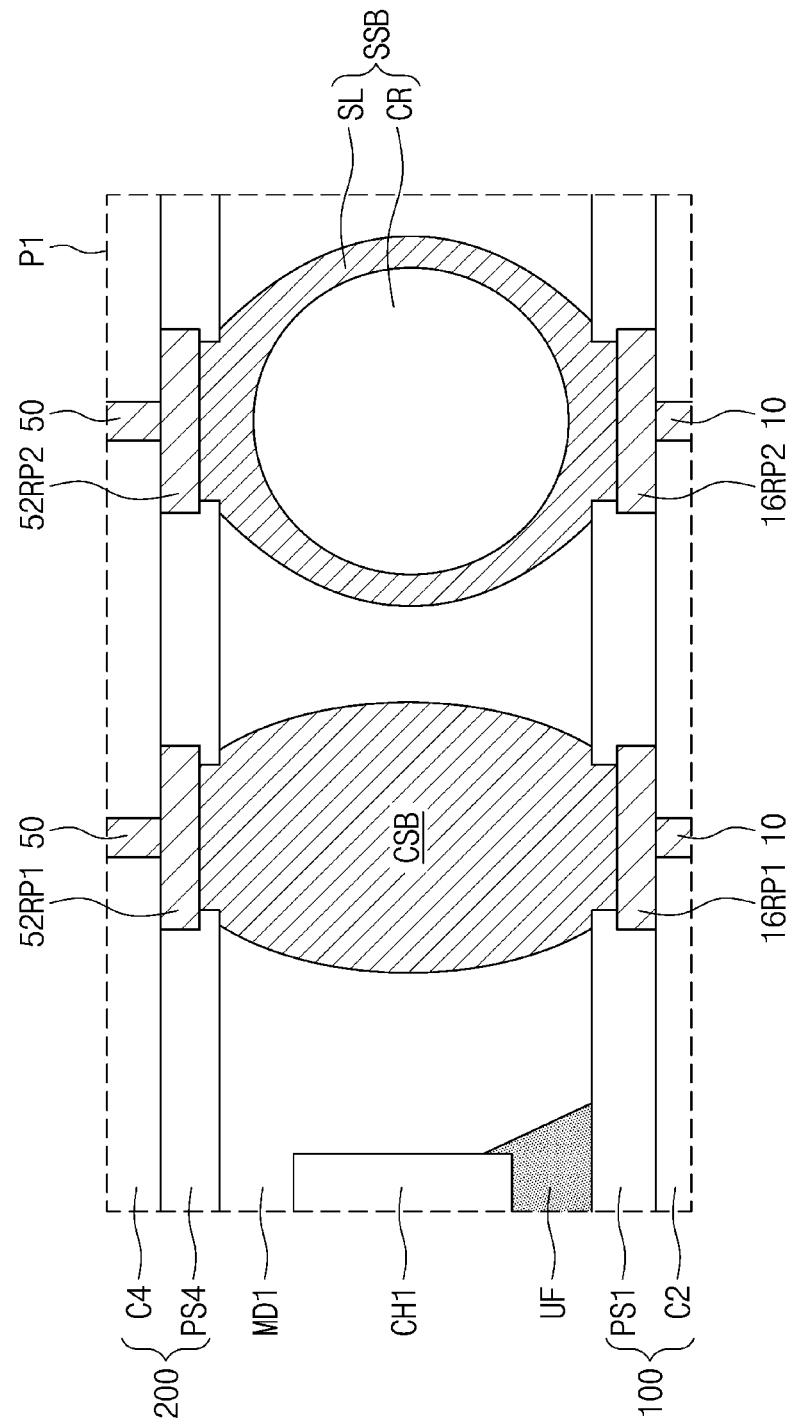
FIG. 12 is an enlarged sectional view illustrating a portion 'P1' of FIG. 11.

FIG. 11 is a sectional view taken along the line A-A' of FIG. 1. FIG. 12 is an enlarged sectional view illustrating a portion 'P1' of FIG. 11.

Referring to FIGS. 11 and 12, in a semiconductor package 1003 according to the present embodiment, the first substrate 100 may include first substrate connection pads 16RP1 and 16RP2 provided on the second body layer C2, and the second substrate 200 may include the second substrate connection pads 52RP1 and 52RP2 provided on the bottom surface of the fourth body layer C4.

The first substrate connection pads 16RP1 and 16RP2 may include an eleventh substrate connection pad 16RP1 and a twelfth substrate connection pad 16RP2. The first vias 10 may be connected to both of the eleventh and twelfth substrate connection pads 16RP1 and 16RP2, and the eleventh and twelfth substrate connection pads 16RP1 and 16RP2 may be used as a transmission path of an electrical signal. The eleventh substrate connection pad 16RP1 may be closer to the first semiconductor device CH1 than the twelfth substrate connection pad 16RP2. The twelfth substrate connection pad 16RP2 may be disposed adjacent to an edge of the first substrate 100.

The second substrate connection pads 52RP1 and 52RP2 may include a 21-th substrate connection pad 52RP1 and a 22-th substrate connection pad 52RP2. The second vias 50 may be connected to both of the 21-th and 22-th substrate connection pads 52RP1 and 52RP2, and the 21-th and 22-th substrate connection pads 52RP1 and 52RP2 may be used as a transmission path of an electrical signal. The 21-th substrate connection pad 52RP1 may be closer to the first semiconductor device CH1 than the 22-th substrate connection pad 52RP2. The 22-th substrate connection pad 52RP2 may be disposed adjacent to an edge of the second substrate 200.

The substrate connection solder ball CSB may electrically connect the eleventh substrate connection pad 16RP1 to the 21-th substrate connection pad 52RP1. The support solder ball SSB may connect the twelfth substrate connection pad 16RP2 to the 22-th substrate connection pad 52RP2. The solder layer SL of the support solder ball SSB may electrically connect the twelfth substrate connection pad 16RP2 to the 22-th substrate connection pad 52RP2. The support solder ball SSB may support the second substrate 200 and may serve as a transmission path of an electrical signal. Except for these differences, the semiconductor package 1003 according to the present embodiment and the fabrication method thereof may be configured to have the same or similar features as semiconductor package 1002 and the fabrication method of the previous embodiment described with reference to FIGS. 9 and 10.

FIGS. 13A to 13E are plan views illustrating a semiconductor package according to an embodiment of the inventive concept.

Figure 13A:
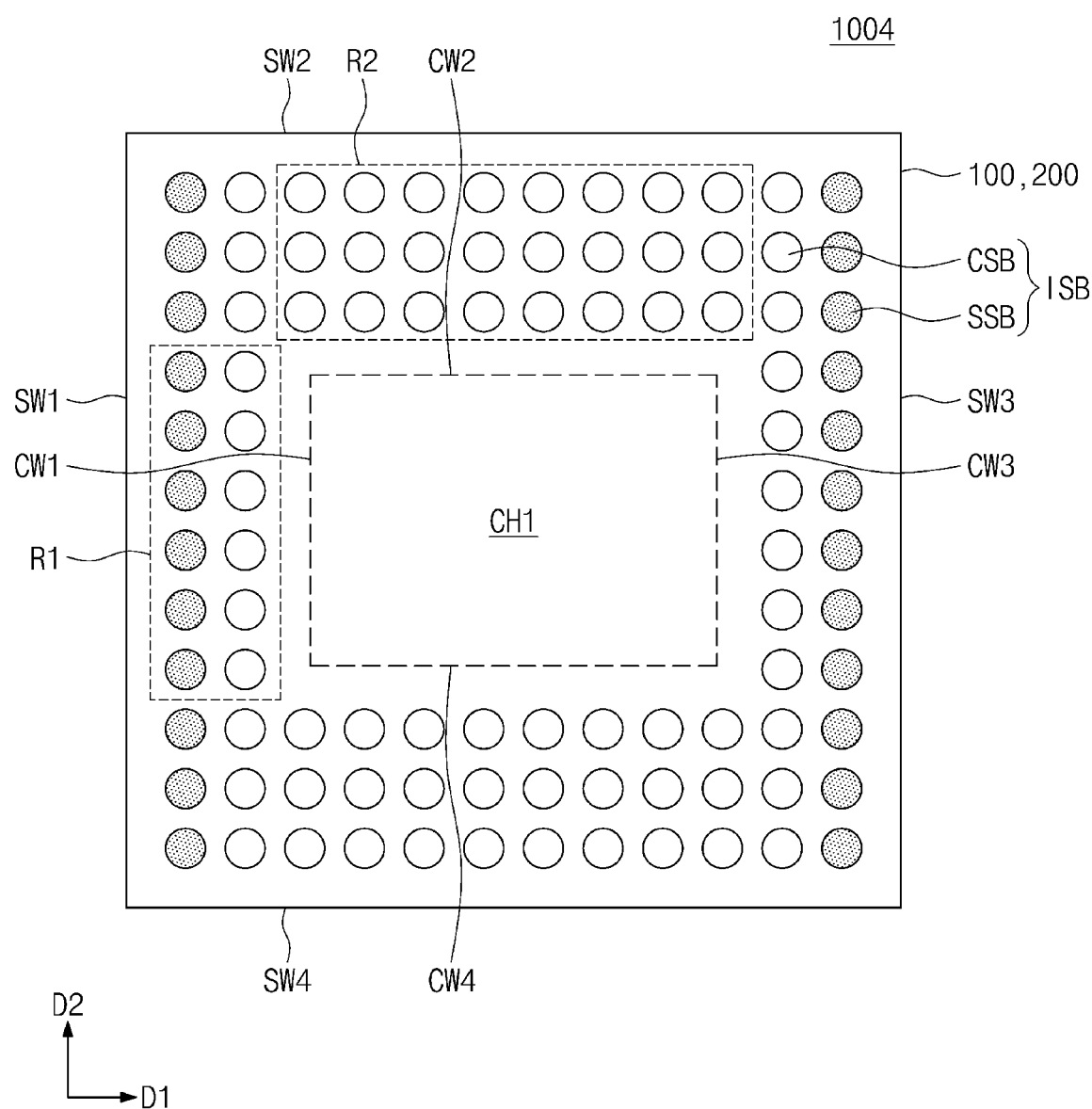
FIGS. 13A, 13B, 13C, 13D and 13E are plan views illustrating a semiconductor package according to an embodiment of the inventive concept.

Referring to FIGS. 2 and 13A, in a semiconductor package 1004 according to the present embodiment, the inner solder balls ISB may be arranged to enclose the first semiconductor device CH1, when viewed in a plan view. The first semiconductor device CH1 may include the first to fourth chip sidewalls CW1 to CW4 disposed in a clockwise direction, when viewed in a plan view. The first substrate 100 may include the first to fourth substrate sidewalls SW1 to SW4 disposed in the clockwise direction, when viewed in a plan view. The first to fourth substrate sidewalls SW1 to SW4 may be adjacent to the first to fourth chip sidewalls CW1 to CW4, respectively.

The inner solder balls ISB may be arranged adjacent to the first chip sidewall CW1 to form m rows parallel to the second direction D2. The inner solder balls ISB may be arranged adjacent to the second chip sidewall CW2 to form n columns parallel to the first direction D1. The numbers m and n are natural numbers and may be equal to or different from each other. In the present embodiment, the numbers m and n may be 2 and 3, respectively. Some of the inner solder balls ISB, which are arranged to form a relatively small number of rows or columns (e.g., m rows) and are adjacent to the first and third substrate sidewalls SW1 and SW3 of the first substrate 100 farthest from the first semiconductor device CH1, may be used as the support solder balls SSB with the cores CR.

In other words, the first substrate 100 may have a first region R1 and a second region R2, which are adjacent to the first and second chip sidewalls CW1 and CW2 of the first semiconductor device CH1, respectively. The inner solder balls ISB may be arranged in the first region R1 to form two rows in the second direction D2. The inner solder balls ISB may be arranged in the second region R2 to form three columns in the first direction D1. Some of the inner solder balls ISB, which are disposed in the first region R1 in which the inner solder balls ISB are arranged in a relatively small number of rows or columns and are farthest from the first chip sidewall CW1, may be used as the support solder balls SSB with the cores CR.

At a portion of the semiconductor package 1004, in which the inner solder balls ISB are arranged in a relatively small number of rows or columns (e.g., m rows), warpage may occur or the second substrate 200 may not be sufficiently supported. If, as described with reference to FIGS. 1 to 10, the support solder balls SSB are used as only a supporting element and are not used as a transmission path of an electrical signal, since the number of the support solder balls SSB increases, the degree of freedom in constructing a routing structure decreases. In the present embodiment, by selectively disposing the support solder ball SSB at a region vulnerable to warpage, it is possible to increase a degree of freedom in constructing a routing structure and to effectively suppress warpage.

Figure 13B:
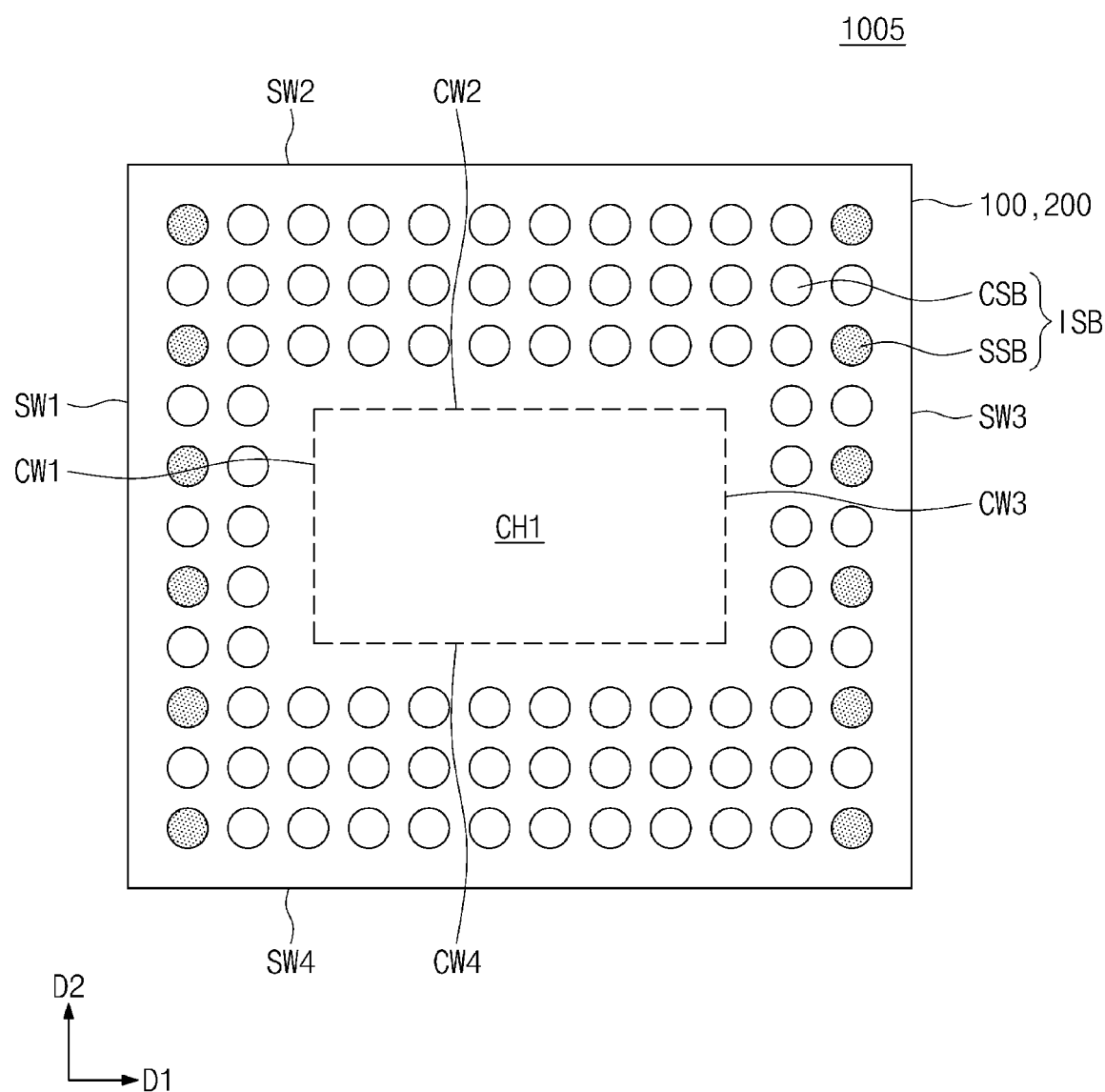

Referring to FIG. 13B, in a semiconductor package 1005 according to the present embodiment, the support solder balls SSB and the substrate connection solder balls CSB, which are adjacent to the first and third substrate sidewalls SW1 and SW3 of the first substrate 100, may be alternately disposed in the second direction D2.

Figure 13C:
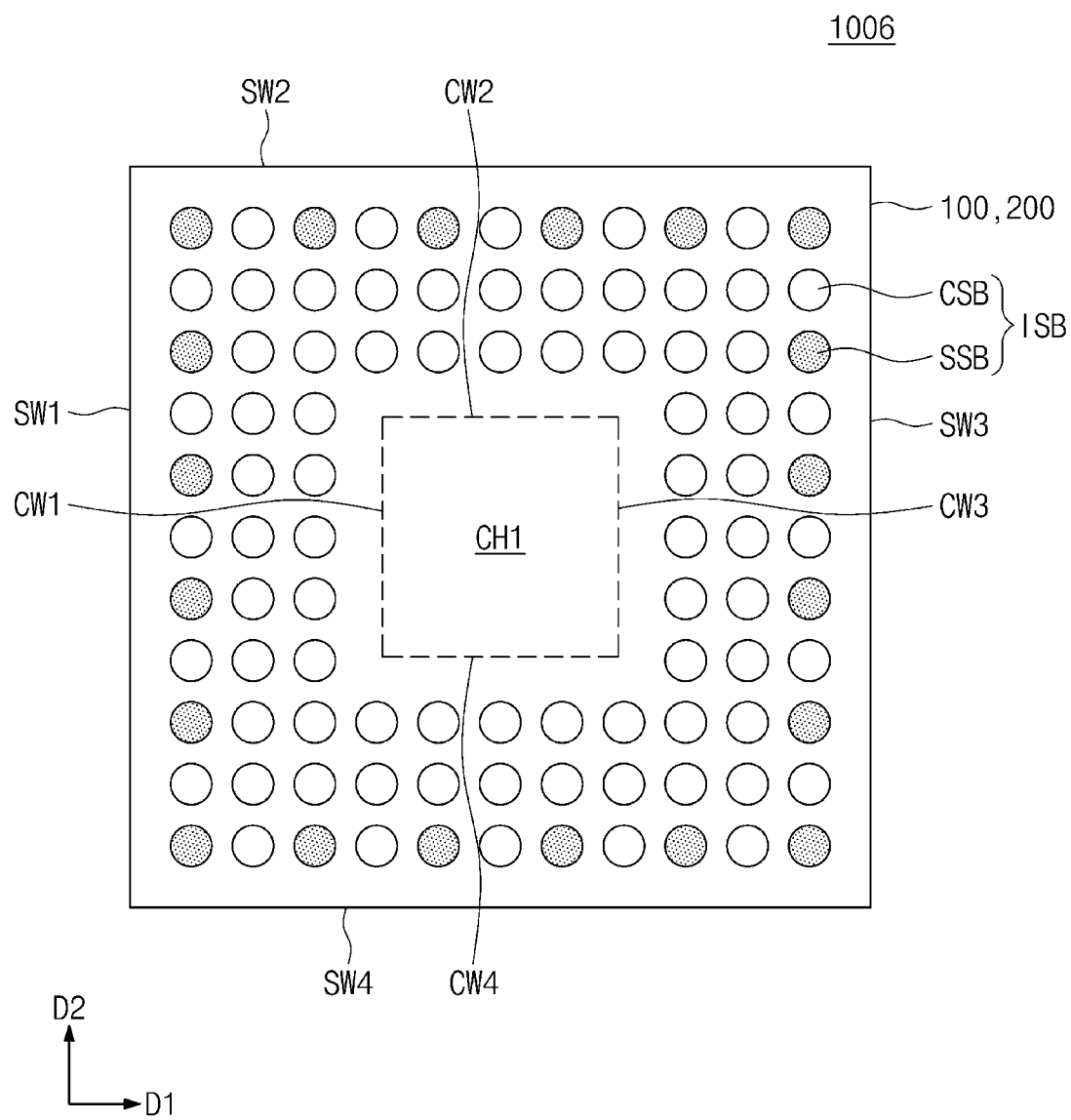

Referring to FIG. 13C, in a semiconductor package 1006 according to the present embodiment, the inner solder balls ISB may be arranged to form three columns near each of the first to fourth chip sidewalls CW1 to CW4. The support solder balls SSB and the substrate connection solder balls CSB, which are adjacent to the first to fourth substrate sidewalls SW1 to SW4 of the first substrate 100, may be alternately disposed.

Figure 13D:
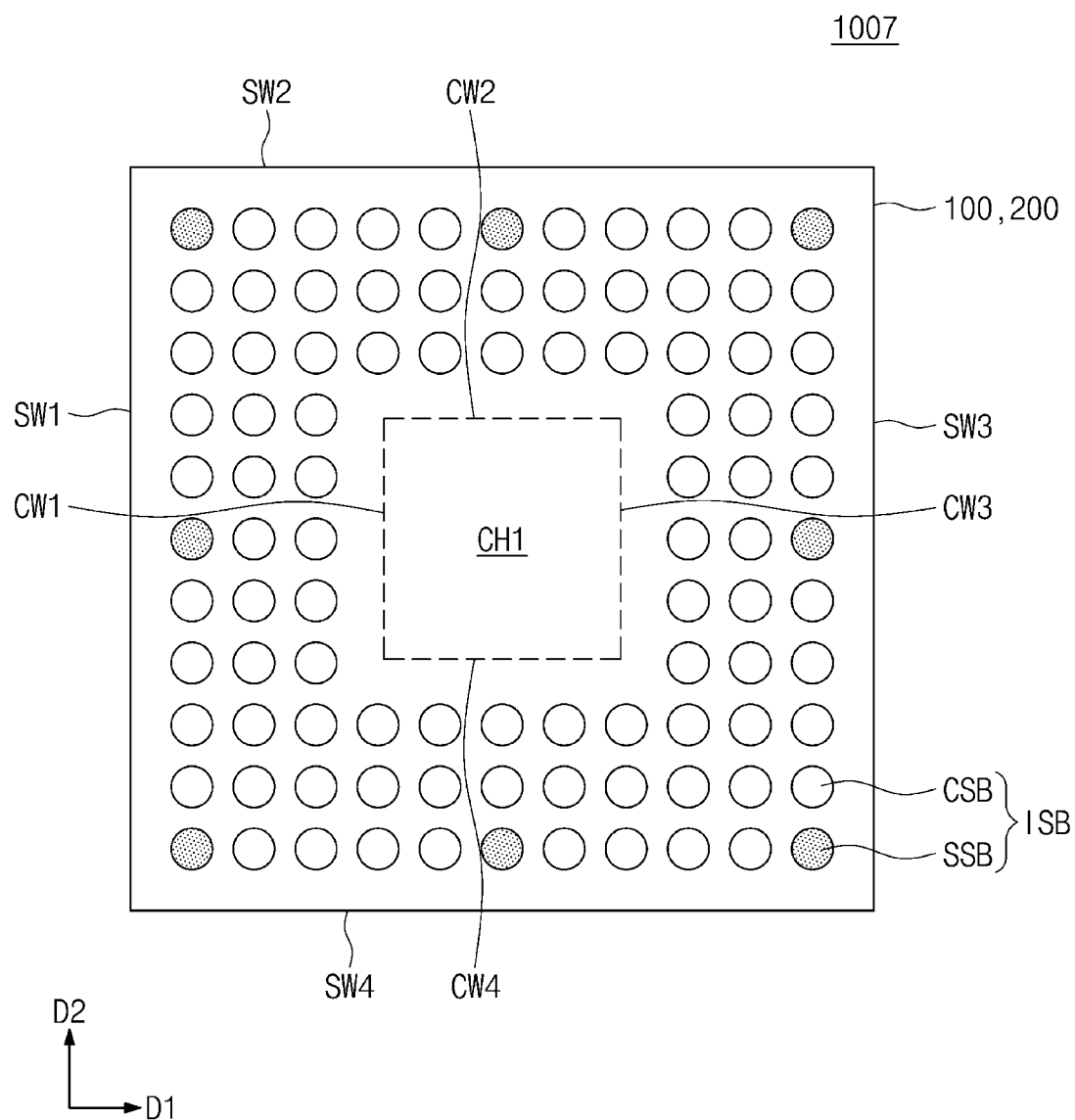

Referring to FIG. 13D, in a semiconductor package 1007 according to the present embodiment, the inner solder balls ISB may be arranged to form three columns near each of the first to fourth chip sidewalls CW1 to CW4. The support solder balls SSB may be arranged near four corners of the semiconductor package 1007. In addition, the support solder balls SSB may be disposed near centers of the first to fourth substrate sidewalls SW1 to SW4.

Figure 13E:
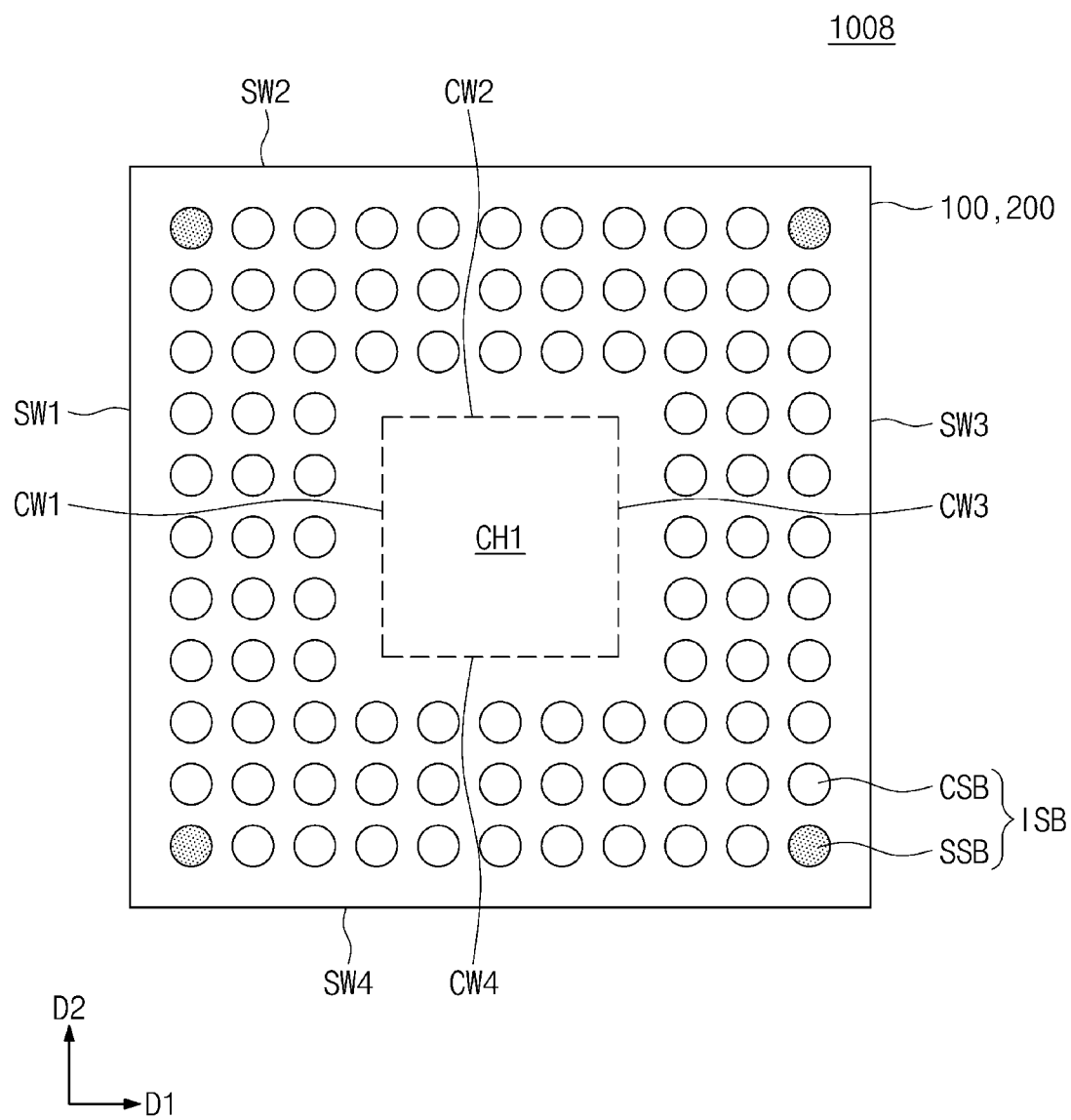

Referring to FIG. 13E, in a semiconductor package 1008 according to the present embodiment, the support solder balls SSB may be disposed near only four corners of the semiconductor package 1007. In the embodiments of FIGS. 13C to 13E, when the inner solder balls ISB are arranged to form three columns near each of the first to fourth chip sidewalls CW1 to CW4, the support solder balls SSB may also be disposed near the first to fourth substrate sidewalls SW1 to SW4 and may be spaced apart from each other by the constant distance. In this case, it is possible to prevent a force, which is exerted when the second substrate 200 is mounted on the first substrate 100, from being concentrated on a local region.

FIGS. 13A to 13E illustrate various example arrangements of the support solder ball SSB, and by selectively disposing the support solder ball SSB, it is possible to increase a degree of freedom in constructing a routing structure and to effectively suppress a warpage phenomenon.

Figure 14:
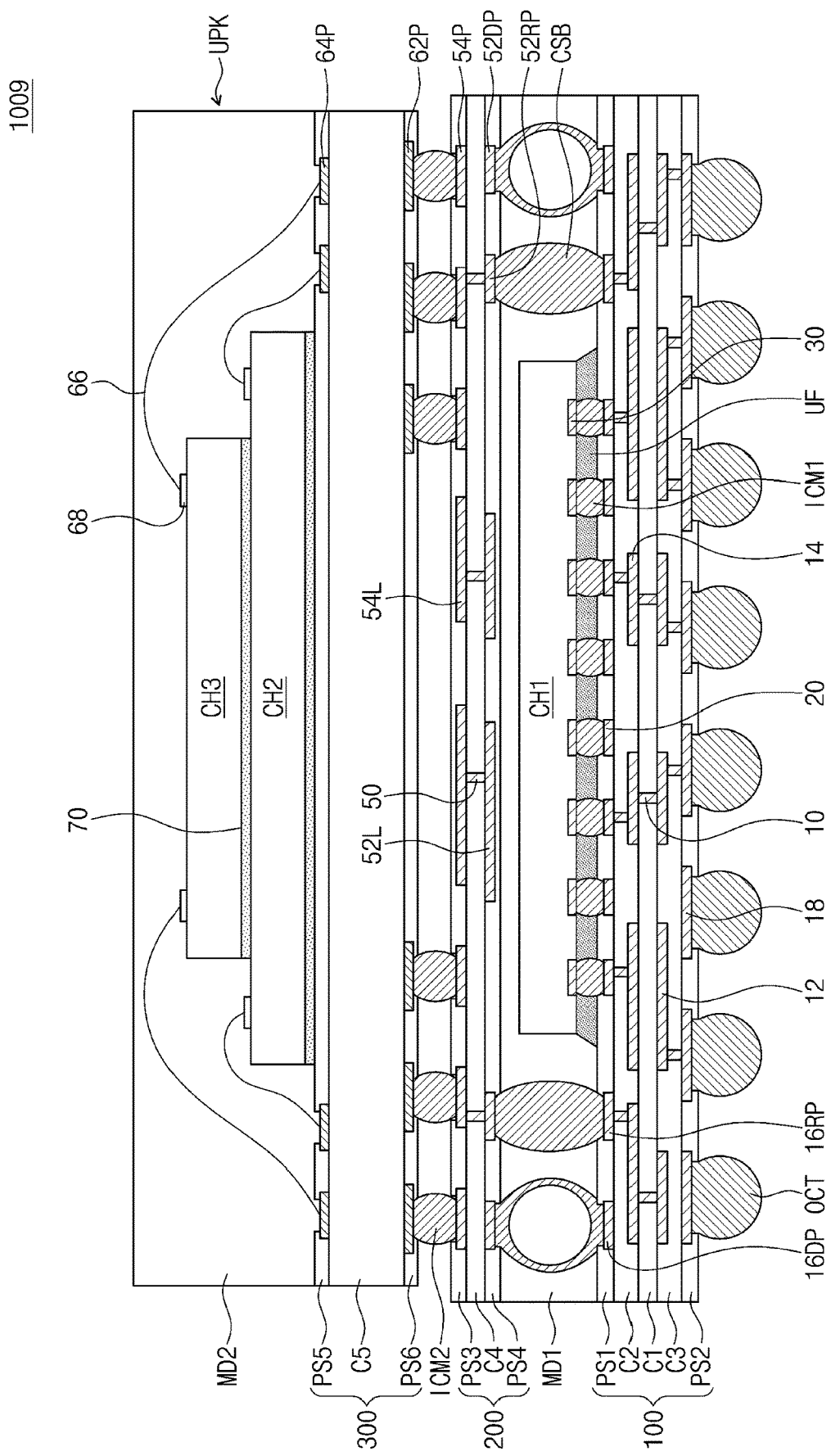
FIG. 14 is a sectional view illustrating a semiconductor package according to an embodiment of the inventive concept.

FIG. 14 is a sectional view illustrating a semiconductor package according to an embodiment of the inventive concept.

Referring to FIG. 14, a semiconductor package 1009 according to the present embodiment may have the same structure as that shown in FIG. 2 but may further include an upper semiconductor package UPK mounted on the second substrate 200. The chip pads 30 of the first semiconductor device CH1 may be connected to the chip connection pad 20 in a flip-chip bonding manner by first inner connection members ICM1. The upper semiconductor package UPK may be connected to the second substrate 200 by second inner connection members ICM2. The upper semiconductor package UPK may have a third substrate 300, a second semiconductor device CH2 and a third semiconductor device CH3, which are stacked thereon, and a second mold layer MD2 covering the second semiconductor device CH2 and the third semiconductor device CH3. Each of the second and third semiconductor devices CH2 and CH3 may be one of image sensor chips (e.g., a CMOS imaging sensor (CIS)), memory device chips (e.g., FLASH memory chips, DRAM chips, SRAM chips, EEPROM chips, PRAM chips, MRAM chips, ReRAM chips, high bandwidth memory (HBM) chips, hybrid memory cubic (HMC) chips), microelectromechanical system (MEMS) chips, or application-specific integrated circuit (ASIC) semiconductor chips.

The third substrate 300 may be, for example, a double-sided printed circuit board. The third substrate 300 may include a fifth body layer C5, a third upper protection layer PS5 covering a top surface of the fifth body layer C5, and a third lower protection layer PS6 covering a bottom surface of the fifth body layer C5. Third upper conductive pads 64P may be disposed on a top surface of the fifth body layer C5, and third lower conductive pads 62P may be disposed on a bottom surface of the fifth body layer C5. The second and third semiconductor devices CH2 and CH3 may be bonded to the third substrate 300 using an adhesive layer 70. The second and third semiconductor devices CH2 and CH3 may include chip connection terminals 68 provided on top surfaces thereof. Wires 66 may connect the chip connection terminals 68 to the third upper conductive pads 64P. Except for these differences, the semiconductor package 1009 according to the present embodiment may have the same or similar features as the semiconductor packages 1000-1008 of the previous embodiments described with reference to FIGS. 1 to 13E.

Figure 15:
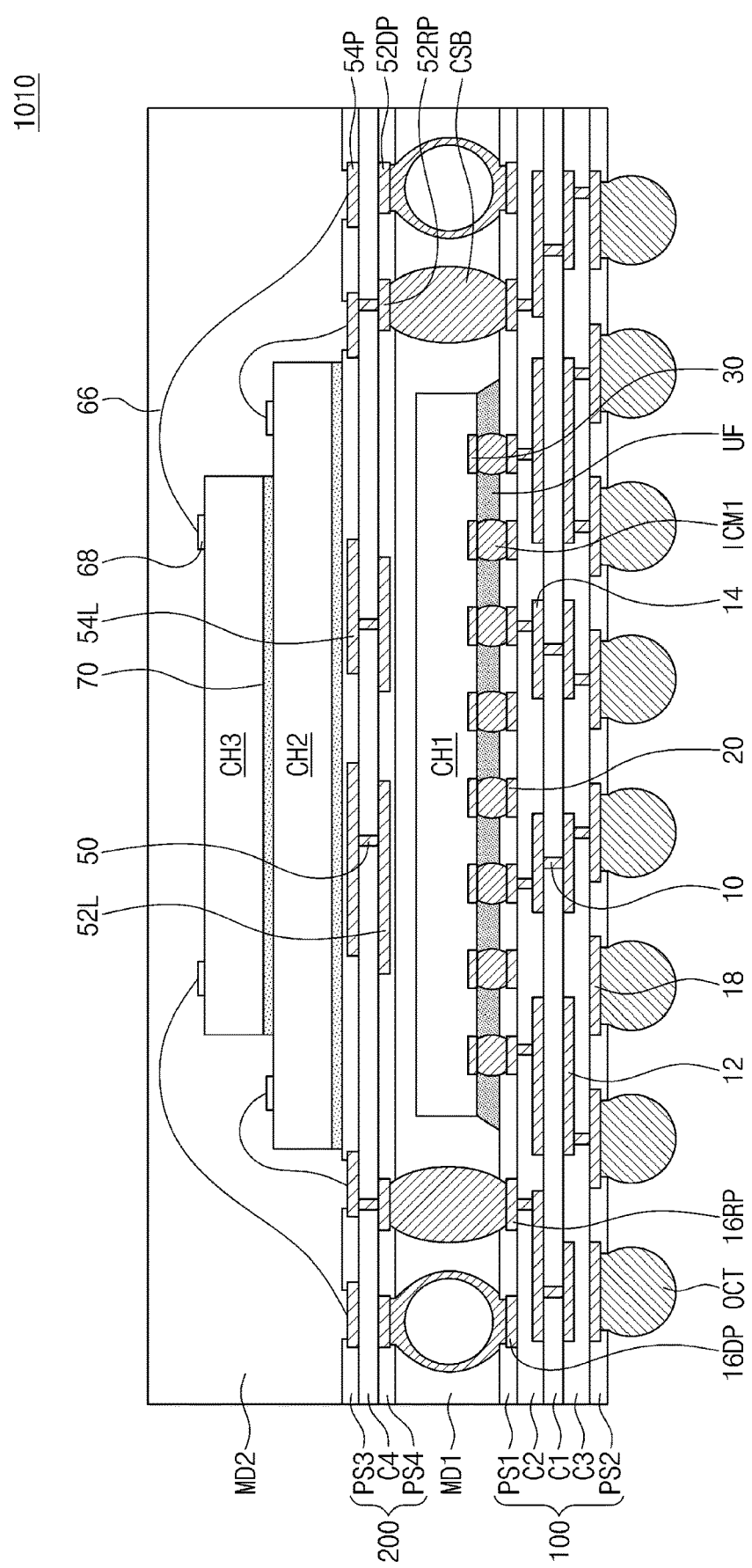
FIG. 15 is a sectional view illustrating a semiconductor package according to an embodiment of the inventive concept.

FIG. 15 is a sectional view illustrating a semiconductor package according to an embodiment of the inventive concept.

Referring to FIG. 15, a semiconductor package 1010 according to the present embodiment may have the same structure as that shown in FIG. 2 but may further include the second and third semiconductor devices CH2 and CH3 mounted on the second substrate 200. The second substrate 200, the second semiconductor device CH2, and the third semiconductor device CH3 may be covered with the second mold layer MD2. The second and third semiconductor devices CH2 and CH3 may be bonded to the second substrate 200 using the adhesive layer 70. The second and third semiconductor devices CH2 and CH3 may include the chip connection terminals 68, which are provided on a top surface thereof. The wires 66 may connect the chip connection terminals 68 to the second upper conductive pads 54p. Except for these differences, the semiconductor package 1010 according to the present embodiment may be configured to have the same or similar features as the semiconductor packages 1000-1009 of the previous embodiments described with reference to FIGS. 1 to 13E.

According to an embodiment of the inventive concept, a semiconductor package may include support solder balls, which are disposed between a first substrate and a second substrate, and each of which includes a core. The support solder balls may be disposed near an edge portion of the first substrate or the second substrate that is most vulnerable to warpage. Thus, it is possible to prevent or suppress warpage in the semiconductor package and to prevent a short circuit between inner solder balls. As a result, it is possible to reduce a failure of the semiconductor package and to increase the reliability of the semiconductor package.

In addition, when the first substrate is bonded to the second substrate, a distance between the second substrate and a first semiconductor device may be constantly maintained by the support solder balls, and thus, a conventional support patch may not be required. Thus, it is possible to omit a process of forming a support patch and to simplify a fabrication process. In addition, a flux agent may be effectively removed, and thus, it is possible to prevent a delamination issue in a mold layer caused by a remaining portion of the flux agent. Furthermore, the mold layer may be formed to have a constant thickness on the first semiconductor device, and thus, it is possible to increase a flatness property of the semiconductor package and to suppress the warpage and a shifting.

While example embodiments of the inventive concept have been particularly shown and described, it will be understood by one of ordinary skill in the art that variations in form and detail may be made thereto without departing from the spirit and scope of the inventive concept as set forth in the attached claims. The embodiments of FIGS. 1 to 15 may be combined with each other.

What is claimed is:

1. A semiconductor package, comprising:
   a first substrate;
   a first semiconductor device on the first substrate;
   a first mold layer covering the first semiconductor device;
   a second substrate on the first mold layer;
   a support solder ball interposed between the first substrate and the second substrate, and electrically disconnected from the first substrate or the second substrate, wherein the support solder ball includes a core and is disposed near a first sidewall of the first semiconductor device; and
   a substrate connection solder ball disposed between the first sidewall of the first semiconductor device and the support solder ball to electrically connect the first substrate to the second substrate,
   wherein a top surface of the first semiconductor device has a first height from a top surface of the first substrate,
   the core has a second height which is equal to or greater than the first height, and
   the second height is measured from a bottom surface of the core to a top surface of the core.

2. The semiconductor package of claim 1, wherein the first substrate comprises a first body layer and a first protection layer overlapping a top surface of the first body layer,
   the second substrate comprises a second body layer and a second protection layer overlapping a bottom surface of the second body layer,
   the first substrate or the second substrate further comprises a dummy conductive pad overlapped with the first protection layer or the second protection layer, and
   the support solder ball penetrates the first protection layer or the second protection layer to be in contact with the dummy conductive pad.

3. The semiconductor package of claim 2, wherein the support solder ball is in contact with a top surface of the first protection layer or a bottom surface of the second protection layer.

4. The semiconductor package of claim 2, wherein a portion of the first mold layer is interposed between the first protection layer and the support solder ball or between the second protection layer and the support solder ball.

5. The semiconductor package of claim 2, wherein a first end portion of the core is in contact with the dummy conductive pad, and
   a second end portion of the core is in contact with a top surface of the first protection layer or a bottom surface of the second protection layer.

6. The semiconductor package of claim 2, wherein the first protection layer or the second protection layer comprises a dummy hole which exposes the first body layer or the second protection layer and overlaps the support solder ball, and
   the support solder ball is in contact with the first body layer or the second body layer exposed through the dummy hole.

7. The semiconductor package of claim 2, wherein the first protection layer or the second protection layer comprises a dummy hole which exposes the first body layer or the second protection layer and overlaps the support solder ball, and
   the first mold layer is interposed between the support solder ball and the first body layer or between the support solder ball and the second body layer and is in contact with a sidewall of the dummy hole.

8. The semiconductor package of claim 1, wherein the core has a spherical shape, a circular pillar shape, a cube shape, an ellipsoid shape, a rectangular parallelepiped shape, a regular tetrahedron shape, or a pillar shape having a bottom surface wider than a top surface.

9. The semiconductor package of claim 1, wherein the core comprises copper, aluminum, nickel, stainless steel (SUS), ceramics, or polymer.

10. The semiconductor package of claim 1, wherein the substrate connection solder ball has a first width, and
    the support solder ball has a second width which is equal to or larger than the first width.

11. The semiconductor package of claim 1, wherein the substrate connection solder ball has a core-free structure.

12. The semiconductor package of claim 1, wherein the substrate connection solder ball and the support solder ball are provided in plural to constitute inner solder balls, which enclose the first semiconductor device, between the first substrate and the second substrate,
    the first semiconductor device has the first sidewall and a second sidewall,
    the first sidewall is parallel to a first direction,
    the second sidewall is parallel to a second direction orthogonal to the first direction,
    first inner solder balls of the inner solder balls are arranged near the first sidewall of the first semiconductor device to form in rows parallel to the first direction,
    second inner solder balls of the inner solder balls are arranged near the second sidewall of the first semiconductor device to form a columns parallel to the second direction,
    m is smaller than n, and
    the support solder ball is one of the first inner solder balls and is placed at a position farthest from the first sidewall.

13. The semiconductor package of claim 12, wherein the support solder ball comprises a plurality of support solder balls which are arranged to form one row parallel to the first sidewall, and
    at least one of the substrate connection solder mils is disposed between adjacent ones of the support solder halls.

14. The semiconductor package of claim 1, further comprising:
    a second semiconductor device disposed on the second substrate; and
    a second mold layer covering the second semiconductor device.

15. The semiconductor package of claim 14, further comprising a third substrate interposed between the second substrate and the second semiconductor device,
    wherein the second semiconductor device is mounted on the third substrate.

16. The semiconductor package of claim 1, wherein a difference between the first height and the second height is 10 µm to 50 µm.

17. A semiconductor package, comprising:
a first substrate;
a first semiconductor device, which is disposed on the first substrate and has a first sidewall and a second sidewall, which are orthogonal to each other when viewed in a plan view, wherein the first sidewall and the second sidewall are parallel to a first direction and a second direction, respectively;
a second substrate on the first semiconductor device; and
inner solder balls disposed between the first substrate and the second substrate to enclose the first semiconductor device,
wherein the inner solder balls comprise:
first inner solder balls, which are arranged near the first sidewall of the first semiconductor device to form m rows parallel to the first direction; and
second inner solder balls, which are arranged near the second sidewall of the first semiconductor device to form n columns parallel to the second direction,
n is greater than m, and
at least one of the first inner solder balls, which is farthest from the first sidewall, comprises a core provided therein, and the at least one first inner solder ball that includes the core is electrically disconnected from the first substrate or the second substrate.

18. The semiconductor package of claim 17, wherein some of the first inner solder balls, which are adjacent to the first sidewall, and the second inner solder balls have a core-free structure.

19. A semiconductor package, comprising:
a first substrate;
a first semiconductor device on the first substrate;
an under-fill layer between the first semiconductor device and the first substrate;
a mold layer covering the first semiconductor device;
a second substrate on the mold layer;
a support solder ball interposed between the first substrate and the second substrate, and electrically disconnected from the first substrate or the second substrate, wherein the support solder ball includes a core and is disposed near a first sidewall of the first semiconductor device; and
a substrate connection solder ball disposed between the first sidewall of the first semiconductor device and the support solder ball to electrically connect the first substrate to the second substrate,
wherein the support solder ball is in contact with a top surface of the first substrate or a bottom surface of the second substrate,
a top surface of the first semiconductor device has a first height from the top surface of the first substrate,
the core has a second height greater than the first height,
the second height is measured from a bottom surface of the core to a top surface of the core, and
a difference between the second height and the first height is 10 µm to 50 µm.

20. The semiconductor package of claim 19, wherein the first substrate comprises a first body layer and a first protection layer covering a top surface of the first body layer,
the second substrate comprises a second body layer and a second protection layer covering a bottom surface of the second body layer,
the first substrate or the second substrate further comprises a dummy conductive pad, which is covered with the first protection layer or the second protection layer, and
the support solder ball penetrates the first protection layer or the second protection layer to be in contact with the dummy conductive pad.

* * * * *